(12) United States Patent
Kodoi et al.

(10) Patent No.: US 12,160,951 B2
(45) Date of Patent: Dec. 3, 2024

(54) FLEXIBLE PRINTED CIRCUIT BOARD AND PRINT HEAD

(71) Applicant: CANON KABUSHIKI KAISHA, Tokyo (JP)

(72) Inventors: Takuma Kodoi, Kanagawa (JP); Takamitsu Tokuda, Kanagawa (JP); Satoshi Kimura, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 259 days.

(21) Appl. No.: 17/943,335

(22) Filed: Sep. 13, 2022

(65) Prior Publication Data

US 2023/0088138 A1 Mar. 23, 2023

(30) Foreign Application Priority Data

Sep. 17, 2021 (JP) .................................. 2021-152047

(51) Int. Cl.
*H05K 1/02* (2006.01)
*B41J 2/14* (2006.01)

(52) U.S. Cl.
CPC ........ *H05K 1/0296* (2013.01); *B41J 2/14072* (2013.01); *H05K 1/028* (2013.01)

(58) Field of Classification Search
CPC .... H05K 1/0296; H05K 1/028; H05K 1/0256; B41J 2/14072
See application file for complete search history.

(56) References Cited

U.S. PATENT DOCUMENTS

| 10,029,463 | B2 | 7/2018 | Hayashi | |
| 10,399,338 | B2 | 9/2019 | Hayashi | |
| 2017/0173950 | A1* | 6/2017 | Hayashi | ................... H01B 7/04 |
| 2018/0297361 | A1 | 10/2018 | Hayashi | |

FOREIGN PATENT DOCUMENTS

| JP | 2010-27762 A | 2/2010 |
| JP | 2017-113927 A | 6/2017 |

* cited by examiner

*Primary Examiner* — Bradley W Thies
(74) *Attorney, Agent, or Firm* — VENABLE LLP

(57) ABSTRACT

A flexible printed circuit board whose end part side is connected to a print element substrate capable of ejecting ink using a print element, so as to be capable of transmitting a signal from a control part of a printing apparatus to the print element substrate via wiring and to be capable of transmitting a signal from the print element substrate to the control part via the wiring, wherein a side part side of high-potential wiring includes at least one of a regulation part that regulates penetration of ink and a wiring part that is configured with low-potential ground wiring and low-potential liquid signal line whose signal value transmitted by the control part or operation based on a signal is monitored.

13 Claims, 15 Drawing Sheets

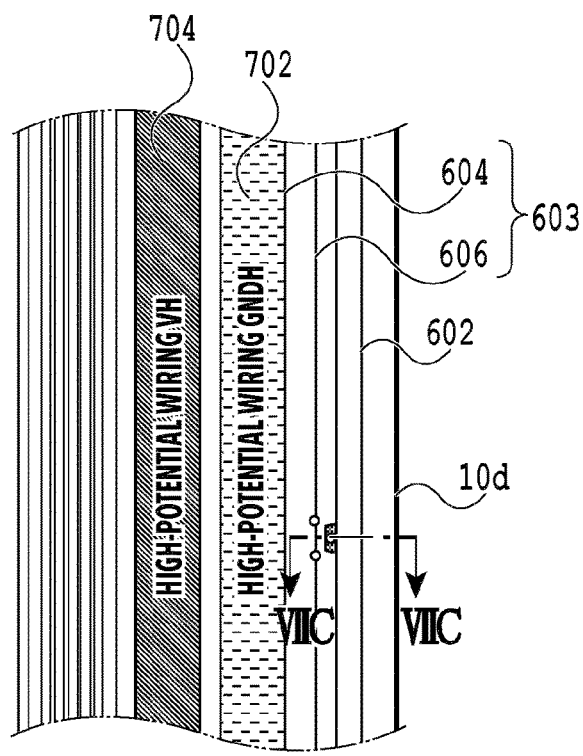
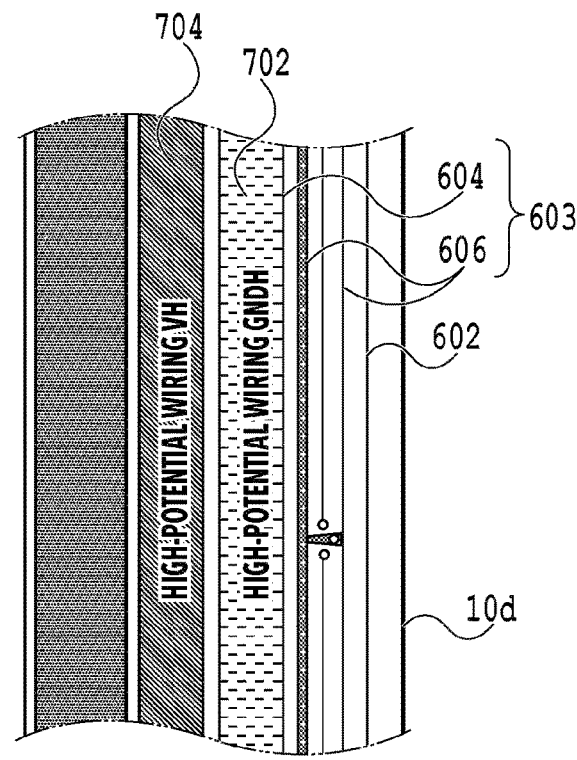
FIG.7A  FIG.7B

FLEXIBLE PRINTED CIRCUIT BOARD AND PRINT HEAD

BACKGROUND OF THE INVENTION

Field of the Invention

The present invention relates to a flexible printed circuit board capable of transmitting a signal to a print element substrate and capable of transmitting a signal from the print element substrate to the outside and a print head equipped with the flexible printed circuit board.

Description of the Related Art

Print heads in printing apparatuses include a print element substrate capable of ejecting ink from a nozzle by driving a print element. Such a print head is connected to a power source substrate, a control substrate, or the like via a flexible printed circuit board with a laminated structure in order to transmit electric power and a drive signal to the print element substrate. Since ink is ejected from the print element substrate, the ink may adhere to the flexible printed circuit board connected to the print element substrate. If ink adheres to a side part of the flexible printed circuit board where the laminated surface is exposed without being connected to another substrate, the ink penetrates from the interface of the laminated layers, and the liquid that has penetrated may cause a short circuit in the wiring arranged in the vicinity of the side part. This may damage the print head using the flexible printed circuit board.

In order to prevent the penetration of ink from a side part, for example, the side part may be reinforced with a reinforcement plate, or the side part may be sealed with a sealing material. Alternatively, as disclosed in Japanese Patent Laid-Open No. 2010-27762, the target portion may be covered with a film.

However, in the case of a configuration in which a side part is reinforced with a reinforcement plate or an entire side part is sealed, the flexible performance of the flexible printed circuit board may be deteriorated. Further, in the case of using the technology of Japanese Patent Laid-Open No. 2010-27762, it is difficult to use the technology of Japanese Patent Laid-Open No. 2010-27762 if a component such as a capacitor is mounted on the flexible circuit board.

SUMMARY OF THE INVENTION

The present invention has been made in view of the above-described problems, and an object thereof is to provide a technology capable of suppressing damage to a print head caused by a short circuit in the wiring due to ink penetration into the inside without deteriorating the performance.

In the first aspect of the present invention, there is provided a flexible printed circuit board whose end part side is connected to a print element substrate capable of ejecting ink using a print element, so as to be capable of transmitting a signal from a control part of a printing apparatus to the print element substrate via wiring and to be capable of transmitting a signal from the print element substrate to the control part via the wiring,
wherein a side part side of high-potential wiring includes at least one of a regulation part that regulates penetration of ink and a wiring part that is configured with low-potential ground wiring and low-potential signal line whose signal value transmitted by the control part or operation based on a signal is monitored.

In the second aspect of the present invention, there is provided a print head including:
a print element substrate capable of ejecting ink by driving a print element; and
a flexible printed circuit board whose end part side is connected to the print element substrate capable of ejecting ink using the print element, so as to be capable of transmitting a signal from a control part of a printing apparatus to the print element substrate via wiring and to be capable of transmitting a signal from the print element substrate to the control part via the wiring, wherein a side part side of high-potential wiring includes at least one of a regulation part that regulates penetration of ink and a wiring part that is configured with low-potential ground wiring and low-potential signal line whose signal value transmitted by the control part or operation based on a signal is monitored.

According to the present invention, it becomes possible to suppress damage to a print head caused by a short circuit in the wiring due to ink penetration.

Further features of the present invention will become apparent from the following description of exemplary embodiments with reference to the attached drawings.

BRIEF DESCRIPTION OF THE DRAWINGS

FIG. 7A to FIG. 7D are diagrams illustrating a wiring part formed on a flexible circuit board;

DESCRIPTION OF THE EMBODIMENTS

Hereinafter, an example of embodiments of the flexible printed circuit board and the print head will be explained with reference to the accompanying drawings. Note that the following embodiments are not intended to limit the present invention, and every combination of the characteristics explained in the embodiments is not necessarily essential to the solution in the present invention. Further, the relative positions, shapes, etc., of the configurations described in the embodiments are merely examples and are not intended to limit the present invention to the range of the examples.

<Configuration of the Print Head>

Figure 1A:
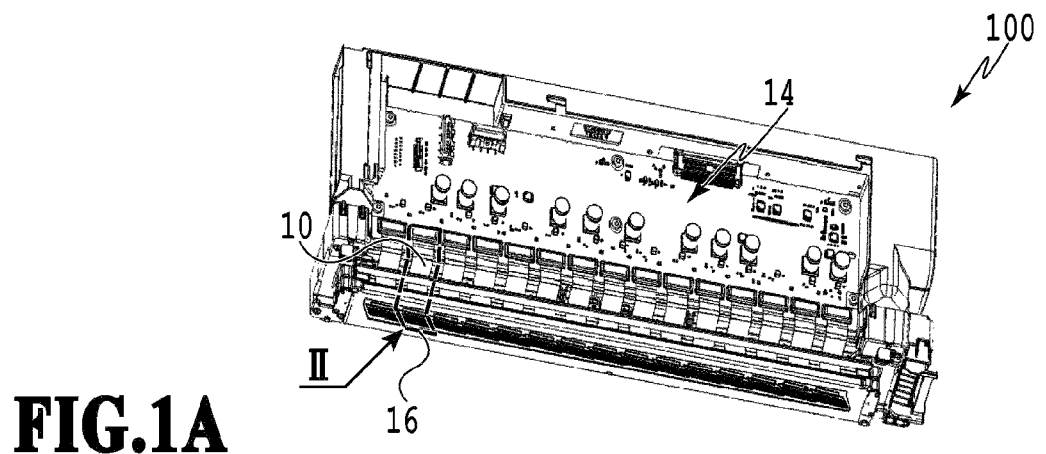
FIG. 1A to FIG. 1C are schematic configuration diagrams of print heads according to an embodiment.
Figure 1B:
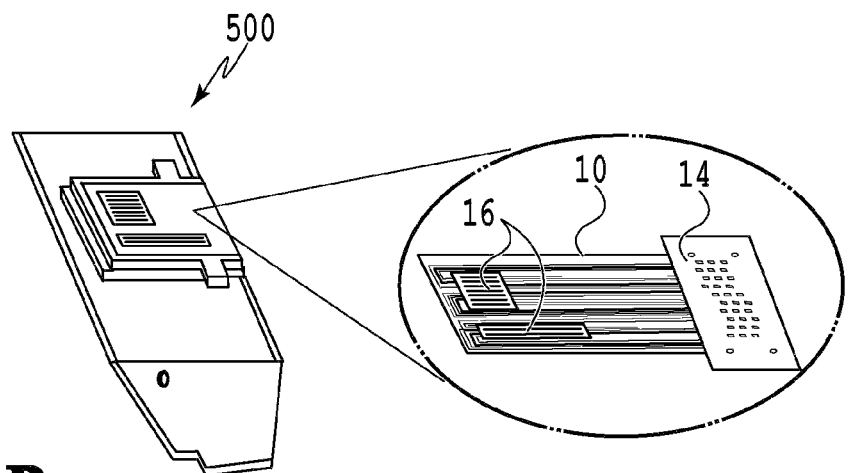
Figure 1C:
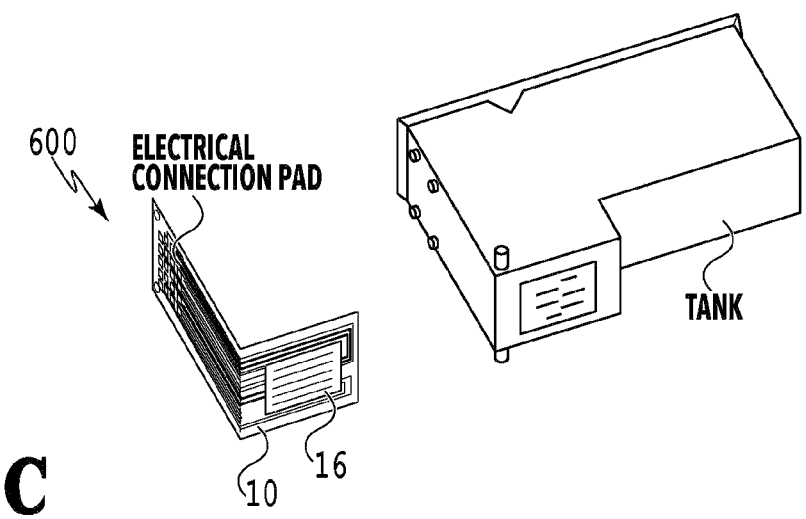
Figure 2:
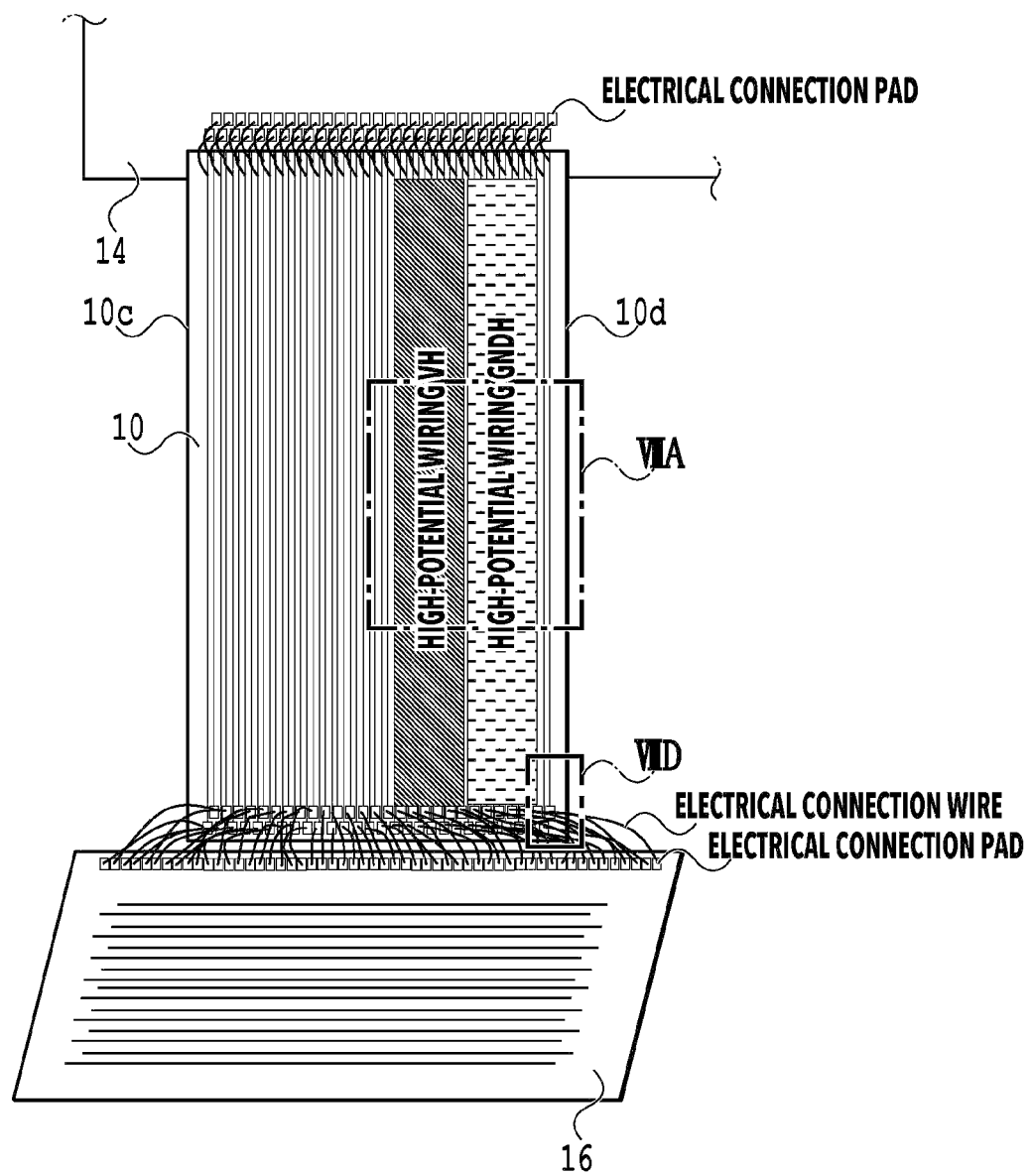
FIG. 2 is an enlarged diagram of the frame II in FIG. 1A.

FIG. 1A to FIG. 1C are schematic configuration diagrams of print heads equipped with a flexible printed circuit board according to the first embodiment. FIG. 1A is a schematic configuration diagram of a print head used in a line type printing apparatus. FIG. 1B is a schematic configuration diagram of a print head used in a serial scan type printing apparatus. FIG. 1C is a schematic configuration diagram of a print head equipped with a pad directly connected to a circuit installed in the main body. FIG. 2 is an enlarged diagram of the frame II part of FIG. 1A. Note that, in the following explanation, the "flexible printed circuit board" is appropriately referred to as a "flexible circuit board".

The print head 100 of FIG. 1A is a print head used in a line type printing apparatus. In the print head 100, the flexible circuit board 10 according to the present embodiment connects the electric wiring substrate 14, which is connected to a control part (not illustrated in the drawings) of the printing apparatus, and the print element substrate 16 capable of ejecting ink by driving a print element. In the print head 100, the multiple print element substrates 16 are arranged side by side, and the area in which the print element substrates 16 are arranged side by side has a length corresponding to the width-direction length of the print area in which printing can be performed by the printing apparatus. The print head 100 prints an image on a print medium by ejecting ink to the print medium conveyed in the direction intersecting the above-mentioned width direction.

As illustrated in FIG. 2, at one end of the flexible circuit board 10, the wiring formed on the flexible circuit board 10 is joined with wires to the corresponding wiring on the electrical wiring substrate 14. Further, at the other end, the wiring formed on the flexible circuit board 10 is joined with wires to the corresponding wiring on the print element substrate 16. Accordingly, the control part installed in the printing apparatus can output various kinds of signals, etc., to the print element substrate 16 via the electric wiring substrate 14 and the flexible circuit board 10. The wires are generally made of aluminum, gold, or the like and are joined by wedge bonding or the like. Note that, although illustration is omitted in FIG. 2, the wires and their joint portions are sealed with a sealing material.

The print head 500 of FIG. 1B is a print head used in a serial scan type printing apparatus. In the print head 500, the flexible circuit board 10 according to the present embodiment connects the electric wiring substrate 14, which is connected to a control part of the printing apparatus, and the print element substrate 16 that ejects ink by driving a print element. The print head 500 alternately executes an ejection operation, which is to eject ink to the print medium conveyed in the conveyance direction while moving in a direction intersecting the conveyance direction, and a conveyance operation, which is to convey the print medium in the conveyance direction, so as to print an image on the print medium.

The chip unit portion formed with the flexible circuit board 10, the electrical wiring substrate 14, and the print element substrate 16 is configured to be basically the same as that of the print head 100. Note that there is not such a limitation that the joined portion is joined with wires and may be joined by thermocompression bonding or the like. Further, the electrical wiring substrate 14 and the flexible circuit board 10 may be connected by using a connector, and various kinds of publicly-known connection methods can be used.

The print head 600 of FIG. 1C is a print head used in a serial scan type printing apparatus and has a configuration in which a unit configured with the flexible circuit board 10 and the print element substrate 16 can be connected to a tank that stores ink to be ejected. In the print head 600, at one end of the flexible circuit board 10 according to the present embodiment, the electric wiring substrate 14 is not connected, and the pad 18 to which a signal from a control part of the printing apparatus or the like is input is installed. The other end is connected to the print element substrate 16.

<Configuration of the Flexible Printed Circuit Board>

In this way, the flexible circuit board 10 according to the present embodiment is not particularly limited in terms of the method of the connection with the print element substrate 16 and the like and the type of the print head to be configured. That is, the flexible circuit board 10 is capable of transmitting an electric signal that is output from a control part of the printing apparatus or the like to the print element substrate 16 and also capable of transmitting a signal from the print element substrate 16 to output the signal to the control part or the like via the electric wiring substrate 14. Note that, in the present embodiment, the print element substrate 16 is configured to generate bubbles in the ink by heating with a heater (print element) to eject ink droplets.

Figures 3A, 3B:
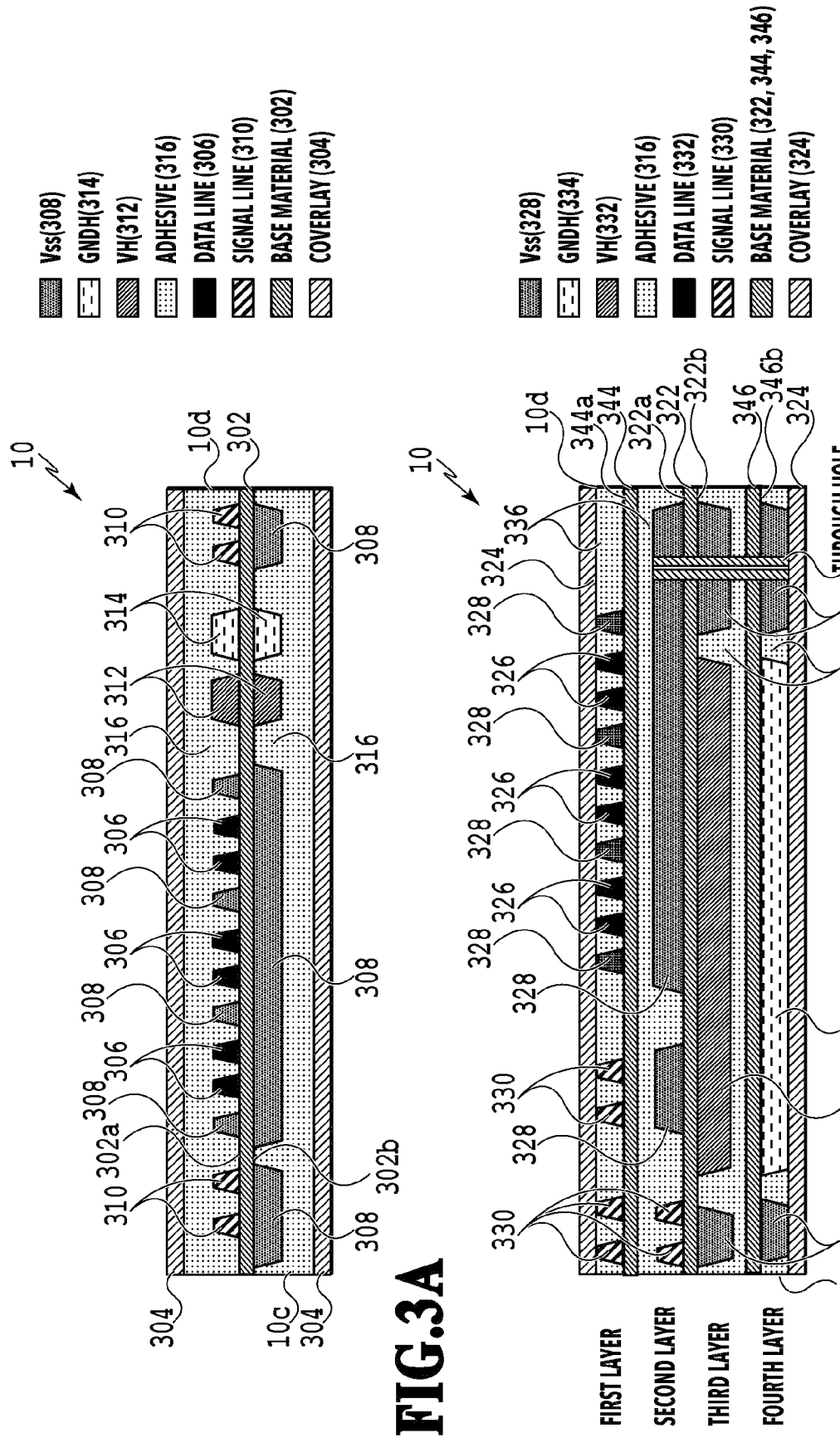
FIG. 3A and FIG. 3B are cross-sectional diagrams illustrating examples of wiring formed on flexible circuit boards.

The flexible circuit board 10 often has a configuration with laminated multiple layers in order to attend to application of a large amount of current, increase in signal lines, and communication by LVDS (Low Voltage Differential Signaling). FIG. 3A and FIG. 3B are cross-sectional diagrams of flexible circuit boards with laminated structures. FIG. 3A is an example of a flexible circuit board with a two-layer structure, and FIG. 3B is an example of a flexible circuit board with a four-layer structure.

The flexible circuit board 10 with a two-layer structure includes the base material 302, and wiring made of copper is laid on the front surface 302a and the back surface 302b thereof. The adhesive 316 is applied to the front surface 302a and the back surface 302b on which the wiring is laid, and the coverlays 304 are attached to the adhesive 316. In FIG. 3A and FIG. 3B, the cross-sectional diagrams in which the flexible circuit boards 10 are cut in a direction intersecting the extending direction of the wiring are formed. Therefore, both side parts 10c and 10d corresponding to the side surfaces of the flexible circuit boards 10 in FIG. 3A and FIG. 3B are exposed to the space when being attached to the print heads as illustrated in FIG. 2.

The arrangement of wiring in a cross section of the flexible circuit board 10 is, for example, as illustrated in FIG. 3A. In FIG. 3A, the data wiring 306 such as LVDS signal lines is formed on the front surface 302a so as to be sandwiched between the VSS wiring 308. Further, on the back surface 302b, in the area corresponding to the area where the data wiring 306 and the VSS wiring 308 are formed on the front surface 302a, the VSS wiring 308 which is a low voltage ground is installed in order to maintain the signal quality against external noise and the like. That is, impedance matching is implemented on this flexible circuit board 10.

On the front surface 302a, various kinds of other signal lines 310 are formed in the vicinity of the side parts 10c and 10d of the flexible circuit board 10, and, on the back surface 302b, the VSS wiring 308 is formed in the area corresponding to the area where the signal lines 310 are formed. Further, on the front surface 302a and the back surface 302b of the base material 302, the VH wiring 312, which is a high-potential heater power source, and the GNDH wiring 314 are parallelly installed at positions corresponding to each other. The reason why the VH wiring 312 and the GNDH wiring 314 are parallelly installed is to aim at the capacitor effect and to suppress the current change due to the influence of the L component. The VH wiring 312 and the GNDH wiring 314 are formed thicker than the other wiring as a measure against heat generation because the current becomes large. Note that, regarding the VH wiring 312 and the GNDH wiring 314, it is also possible that the VH wiring 312 is formed with thick wiring on the front surface 302a, and the GNDH wiring 314 is formed with thick wiring on the back surface 302b in the area corresponding to the area where the VH wiring 312 is formed.

Note that, although not illustrated in FIG. 3A, the same signal lines on the front surface 302a and the back surface 302b are connected via through holes in the flexible circuit board 10 with a two-layer structure. Further, in many cases, the pad of an electric connection part for the electric wiring substrate 14 (illustrated as the electrical connection pad in FIG. 2) is formed on one of the front surface and the back surface of the flexible circuit board 10. Therefore, in this case, in the flexible circuit board 10, the wiring is concentrated on the surface where the pad is installed.

The flexible circuit board 10 with a four-layer structure includes the base material 322, and wiring is laid on the front surface 322a and the back surface 322b thereof. The adhesive 336 is applied to the front surface 322a on which the wiring is laid, and the base material 344 is attached to this adhesive 336. On the front surface 344a of the base material 344, wiring is laid and the adhesive 336 is applied, and the coverlay 324 is attached via this adhesive 336. Further, on the back surface 322b where wiring is laid, the adhesive 336 is applied, and the base material 346 is attached to this adhesive 336. On the back surface 346b of the base material 346, wiring is laid and the adhesive 336 is applied, and the coverlay 324 is attached via this adhesive 336.

The flexible circuit board 10 with a four-layer structure, which has more layers than one with a two-layer structure, has a high degree of freedom in design such as arrangement of wiring, so that VH wiring, GNDH wiring, signal lines, etc., can be formed in different layers. Hereinafter, regarding the flexible circuit board 10 illustrated in FIG. 3B, the layer formed on the front surface 344a of the base material 344 will be explained as the first layer, and the layer formed on the front surface 322a of the base material 322 will be explained as the second layer. Further, the layer formed on the back surface 322b side of the base material 322 will be explained as the third layer, and the layer formed on the back surface 346b side of the base material 346 will be explained as the fourth layer.

The first layer is a layer in which the data wiring 326 such as LVDS signal lines and various signal lines 330 are mainly formed. The second layer is a layer in which the VSS wiring 328 is mainly formed, so that the VSS wiring 328 is formed in the area corresponding to the data wiring 326 and the signal lines 330 of the first layer. The third layer is a layer in which the VH wiring 332, which is a high-potential power source, is mainly formed. The fourth layer is a layer in which the GNDH wiring 334, which is a high-voltage ground, is mainly formed. In the third and fourth layers, the VSS wiring 328 is formed in the vicinity of the side parts 10c and 10d of the flexible circuit board 10.

In FIG. 3B, although through holes are not illustrated except for the VSS wiring 328 since the cross section at a predetermined position in the extending direction of the wiring is illustrated, the same wiring in different layers is connected via a through hole. Further, each wiring is integrated on a surface where a pad (electrical connection pad) exists. The types of wiring illustrated in FIG. 3A and FIG. 3B and their positions are merely examples.

Here, the side parts 10c and 10d of the flexible circuit board 10 are exposed to space in the print head. Therefore, the ink discharged from the print element substrate 16 may adhere to the side parts 10c and 10d of the flexible circuit board 10. Further, as described above, the flexible circuit board has a configuration in which the coverlays are attached via the adhesive to the base materials on which wiring is formed. Therefore, in a case of highly penetrative ink, if the ink adheres to the side parts 10c and 10d, the ink may penetrate from the adhesive surface, i.e., the interface between the base material and the coverlay and the adhesive.

If the ink penetrates from the adhesive surface, the adjacent wiring formed in the layer where the ink has penetrated are connected by the ink, which results in a short circuit. If this short-circuited wiring includes, for example, high-potential wiring such as a heater power source, the print head may be damaged due to smoke generation, ignition, etc., or failure of the print element substrate 16 or the control part of the printing apparatus.

Figure 4:
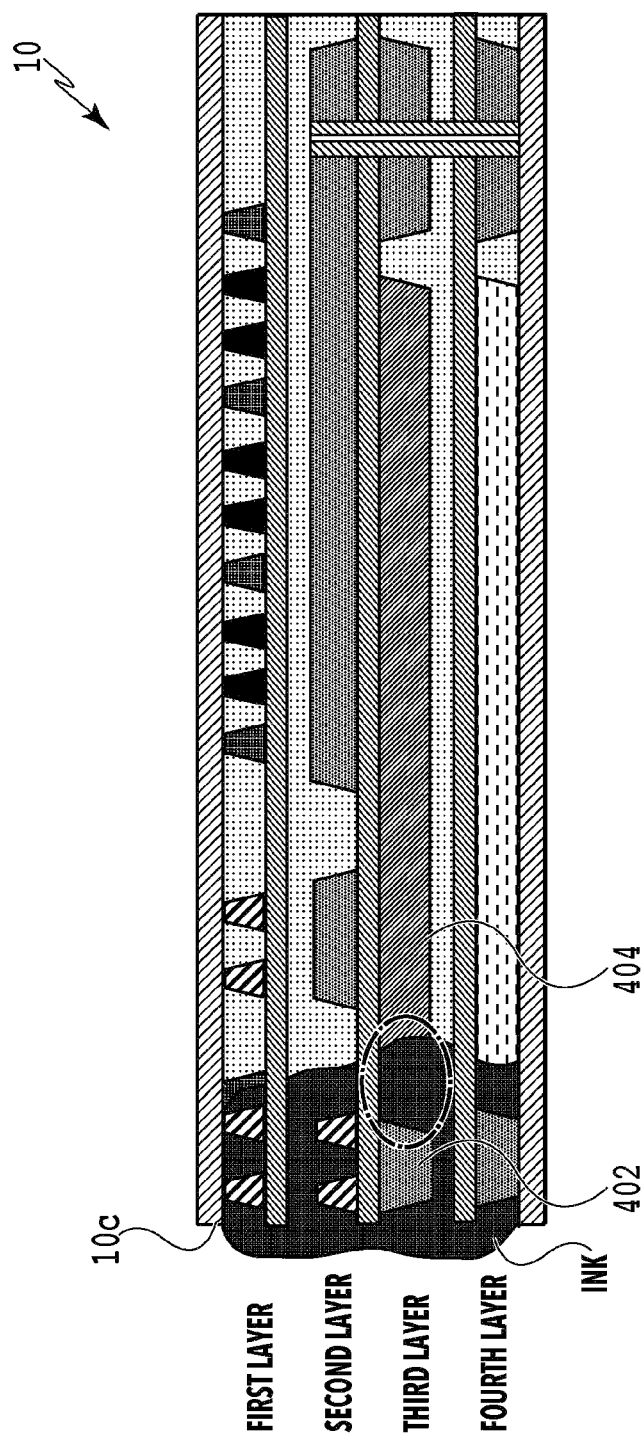
FIG. 4 is a diagram for explaining penetration of ink from a side part.

For example, if ink penetrates from a side part of a flexible circuit board with a four-layer structure, the flexible circuit board will be as illustrated in FIG. 4. FIG. 4 is a diagram illustrating a state in which ink has penetrated from one side part of a flexible circuit board with a four-layer structure. On one side, i.e., the side part 10c, of the flexible circuit board 10, the low-potential VSS wiring 402 and the high-potential VH wiring 404 are formed adjacent to each other in the third layer. If ink penetrates from the side part 10c, the VSS wiring 402 and the VH wiring 404 are electrically connected by the ink in the third layer, which results in a short circuit. When this short circuit occurs, a large current flows in a place where current does not usually flow, which causes the flexible circuit board 10, the electric wiring substrate 14, and the print element substrate 16 to be destroyed or burned due to heat generation, and the print head may be damaged.

Figure 5A:
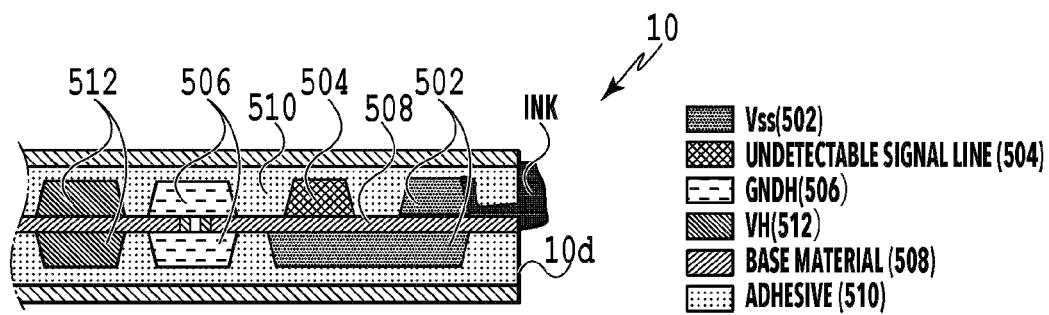
FIG. 5A to FIG. 5F are diagrams for explaining penetration of ink from a side part.
Figure 5B:
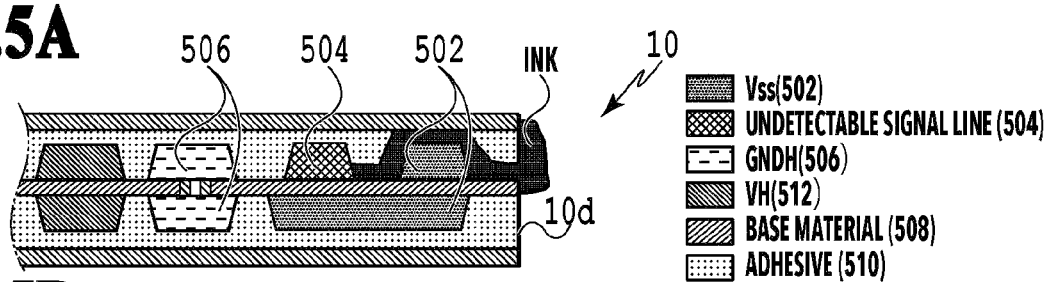
Figure 5C:
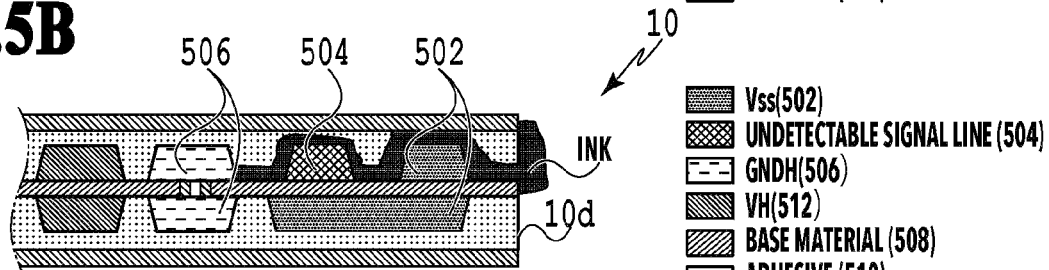

The same applies to a flexible circuit board with a two-layer structure. FIG. 5A to FIG. 5F are diagrams illustrating states in which ink has penetrated from the other side part of a flexible circuit board with a two-layer structure. In FIG. 5A to FIG. 5C, states in which ink has penetrated into the upper layer are illustrated, and, in FIG. 5D to FIG. 5F, states in which ink has penetrated into the lower layer are illustrated. Note that the upper layer is a layer formed on the front surface side of a base material and is also referred to as the first layer. Further, the lower layer is a layer formed on the back surface side of the base material and is also referred to as the second layer.

In the flexible circuit board 10 illustrated in FIG. 5A to FIG. 5C, the VSS wiring 502, which is a low-potential ground wiring, is formed closest to the other side, i.e., the side part 10d, in the upper layer. Further, next to the VSS wiring 502, the signal line 504 in which the change in its signal value cannot be detected even if a short circuit occurs with the VSS wiring 502 is formed. The signal line 504 is wiring in which the signal value transmitted via the signal line 504 is not monitored at all or is not monitored much during normal operation. Further, next to the signal line 504, the high-potential GNDH wiring 506 is formed. Note that, in FIG. 5A to FIG. 5C, the wiring closer to one side, i.e., the side part 10c, than the VH wiring 512 is omitted.

If ink penetrates into such an upper layer, more specifically, if ink penetrates from the interface between the base material 508 and the adhesive 510 in the upper layer, the ink that has penetrated first comes into contact with the VSS wiring 502 (see FIG. 5A). Then, as the penetration of ink progresses, the ink comes into contact with the signal line 504, so that the VSS wiring 502 and the signal line 504 are electrically connected by the ink (see FIG. 5B). Note that the signal line 504 is wiring that is not damaged even if a short circuit occurs with the VSS wiring 502, and, since the signal value is not often monitored via the flexible circuit board 10, the signal value that has changed due to a short circuit and is transmitted by the signal line 504 will not be detected.

Thereafter, if the penetration of ink further progresses, the ink comes into contact with the GNDH wiring 506, so that the GNDH wiring 506, the signal line 504, and the VSS wiring 502 are electrically connected by the ink (see FIG. 5C). Accordingly, a short circuit occurs between the signal line 504 and the VSS wiring 502 via the ink, and a large current flows, which results in burning of the flexible circuit board 10, the print element substrate 16, or the control part due to smoke generation or ignition.

Figure 5D:
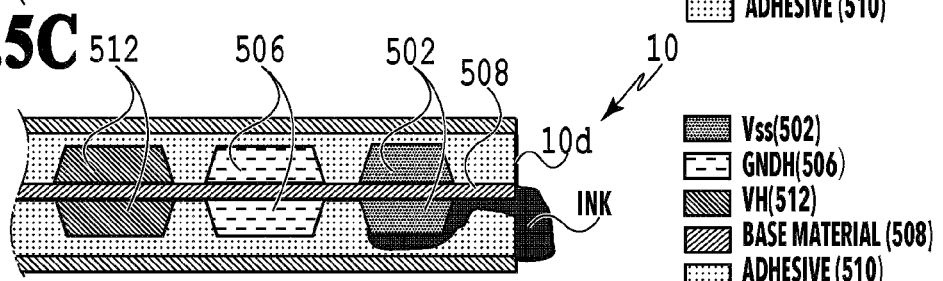
Figure 5E:
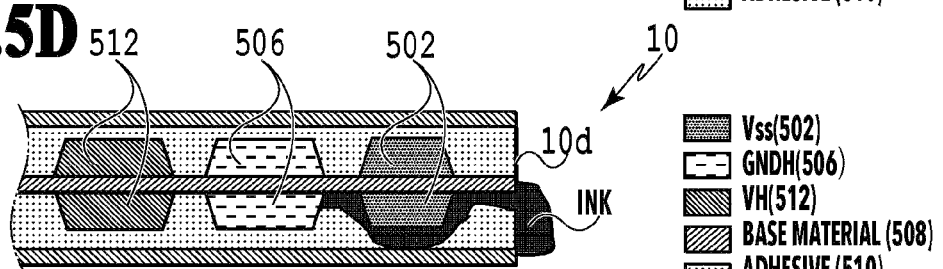
Figure 5F:
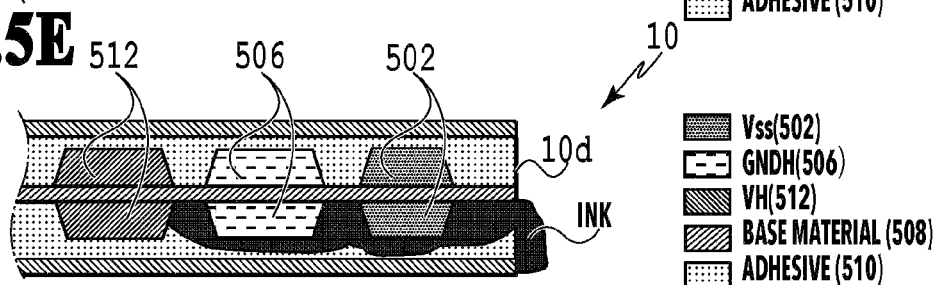

Further, in the flexible circuit board 10 illustrated in FIG. 5D to FIG. 5F, the VSS wiring 502, the GNDH wiring 506, and the VH wiring 512 are formed in order from the other side, i.e., the side part 10d, on each of the front surface and the back surface of the base material 508. Note that, in FIG. 5D to FIG. 5F, the wiring closer to one side, i.e., the side part 10c, than the VH wiring 512 is omitted.

If ink penetrates into the lower layer of the flexible circuit board 10 from the other side, i.e., the side part 10d, of the flexible circuit board 10 as described above, the ink that has penetrated first comes into contact with the VSS wiring 502 (see FIG. 5D). Then, as the penetration of ink progresses, the ink comes into contact with the GNDH wiring 506, so that the VSS wiring 502 and the GNDH wiring 506 are electrically connected by the ink (see FIG. 5E). Note that, since both the VSS wiring 502 and the GNDH wiring 506 have a ground potential, it is difficult to detect an abnormality even if a short circuit occurs between these wiring.

Thereafter, if the penetration of ink further progresses, the ink comes into contact with the VH wiring 512, so that the VH wiring 512 and the GNDH wiring 506 and the VSS wiring 502 are electrically connected by the ink (see FIG. 5F). Accordingly, a short circuit occurs between the VH wiring 512 and the GNDH wiring 506 via the ink, and a large current flows, which results in burning of the flexible circuit board 10, the print element substrate 16, or the control part due to smoke generation or ignition.

<Characteristic Configuration of the Flexible Printed Circuit Board According to the Present Embodiment>

In this way, in the flexible circuit board 10, even though ink penetrates from the side parts 10c and 10d, if the print head does not function normally due to burning or the like, the abnormality that has occurred in the print head cannot be detected. Although it is conceivable to newly add a configuration capable of detecting a short circuit in the wiring arranged near the side parts 10c and 10d, new problems such as an increase in the size of the flexible circuit board 10 will occur. Therefore, the present embodiment is configured so that the penetration of ink into the flexible circuit board 10 can be detected as an abnormality of the print head without installing a new configuration.

Figure 6A:
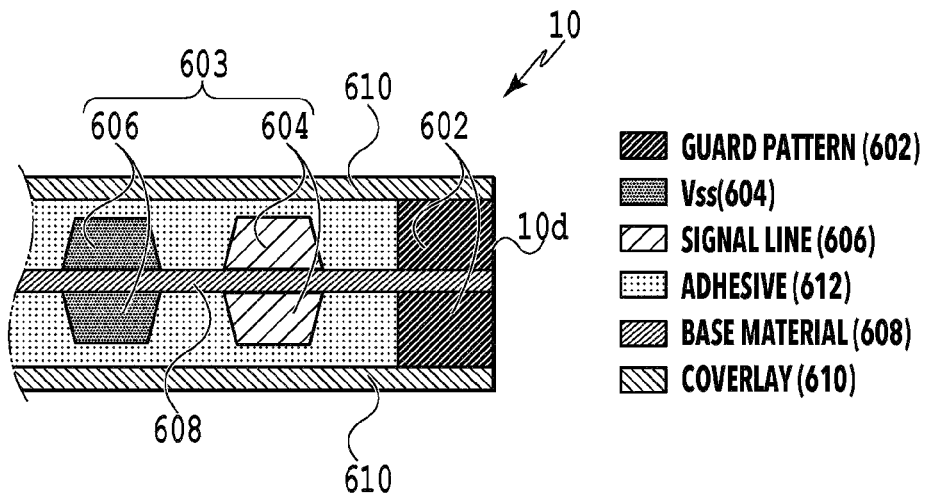
FIG. 6A and FIG. 6B are diagrams illustrating a guard pattern formed on a flexible circuit board.
Figure 6B:
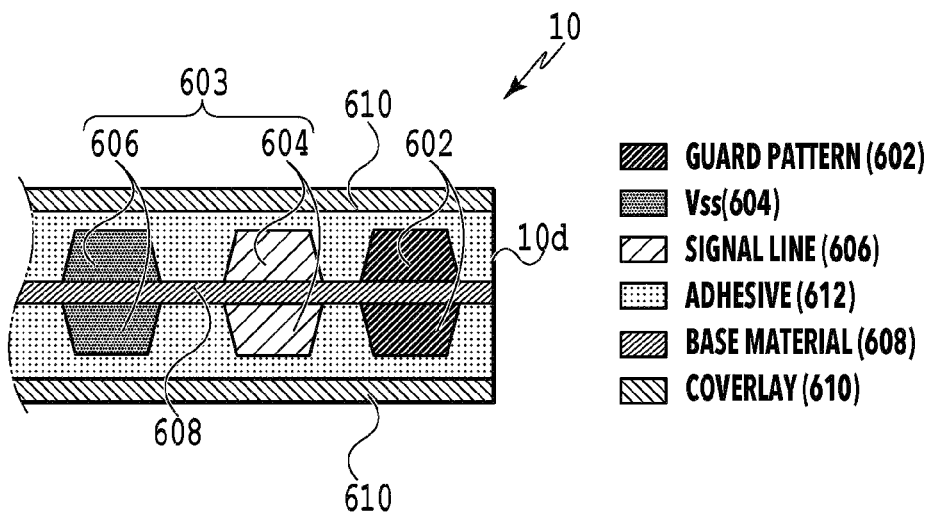

FIG. 6A and FIG. 6B are cross-sectional diagrams of a side part of the flexible circuit board according to the present embodiment and the vicinity thereof. Note that, in the following explanation using FIG. 6A and FIG. 6B, although the configuration of the flexible circuit board 10 on the other side, i.e., the side part 10d, will be explained as an example, the configuration illustrated in FIG. 6A and FIG. 6B may be applied to the one side, i.e., the side part 10c. Further, in FIG. 6A and FIG. 6B, although the wiring of the upper layer and the wiring of the lower layer are similarly arranged from the side part, there is not a limitation as such. That is, it is also possible that the configuration illustrated in FIG. 6A and FIG. 6B is installed in either the upper layer or the lower layer. Furthermore, in FIG. 6A and FIG. 6B, although the flexible circuit board with a two-layer structure is illustrated as an example, the configuration of FIG. 6A and FIG. 6B may be applied to a flexible circuit board with a single-layer structure or may be applied to at least one layer of a flexible circuit board with multiple layers more than two layers.

In the flexible circuit board 10 according to the present embodiment, the guard pattern 602 is formed closest to the side part 10d. Further, next to the guard pattern 602, the wiring part 603 capable of detecting the penetration of ink due to a short circuit is installed. As the wiring of the wiring part 603, new wiring is not formed, but the wiring installed on a general flexible circuit board is formed as the wiring part 603 next to the guard pattern 602. Specifically, the wiring part 603 includes, for example, the two wiring, i.e., the low-potential anode signal line 604, in which the transmitted signal value is monitored relatively frequently, and a low-voltage ground wiring, which is the VSS wiring 606 in the present embodiment. Hereinafter, the guard pattern 602 and the wiring part 603 will be explained in detail.

=Guard Pattern=

The guard pattern 602 is formed, for example, at the side part 10d so as to be longer in the height direction than the other wiring and to be in contact with the base material 608 and the coverlays 610 (see FIG. 6A). Further, for example, the guard pattern 602 is formed so as to have the same length in the height direction as the other wiring on the base material 608 in the vicinity of the side part 10d and to have the adhesive 612 present between the guard pattern 602 and the coverlays 610 (See FIG. 6B). Note that the height direction is the laminating direction in the flexible circuit board 10, that is, the thickness direction. In this way, since the guard pattern 602 is formed in the layer where the wiring is formed, the flexible performance of the flexible circuit board 10 is unlikely to deteriorate.

The guard pattern 602 is configured so as not to be electrically connected to the electric wiring substrate 14 and the print element substrate 16. The material configuring the guard pattern 602 may be a metallic material or a non-metallic material. Examples of the non-metallic material include non-conductive materials such as resin, film, and rubber.

It is preferable to use a non-metallic material for the guard pattern 602 in a case of being installed at the side part 10d as in FIG. 6A. In this case, as the material for forming the guard pattern 602, it is preferable to use a material with high adhesion to the base material 608 and the coverlays 610 and with resistance to penetration of ink. Further, it is more preferable that the material has high adhesion, not only to the base material 608 and the coverlays 610, but also to the adhesive 612. The material with resistance to penetration of ink is, for example, a material with a low affinity for the ink ejected from the print head. In a case where the guard pattern 602 is formed at the side part 10d as in FIG. 6A, a material resistant to corrosion against liquids such as ink and water that may adhere to the flexible circuit board 10 is used.

In a case where the guard pattern 602 is made of a metallic material, if the guard pattern 602 is configured to be capable of being energized, moisture remaining on the surface may be electrolyzed or anodized, which results in progress in corrosion, so that the guard pattern 602 will be easily peeled off from the adhesive 612, etc. Therefore, in a case where a metallic material is used, the guard pattern 602 will be in a state of not being electrically connected (electrically floated), that is, in a state of not being energized. Alternatively, the guard pattern 602 will be connected to an independent ground. In a case where a metallic material is used, corrosion of the metallic material can be suppressed with such a configuration as in FIG. 6B, for example. In the case of such a configuration as in FIG. 6A, a metallic material with high corrosion resistance is used. In the case of the configuration of FIG. 6B, the guard pattern 602 can be formed, for example, in a process of forming another wiring. Therefore, in this case, the guard pattern 602 is configured of copper.

=Wiring Part=

Figure 7C:
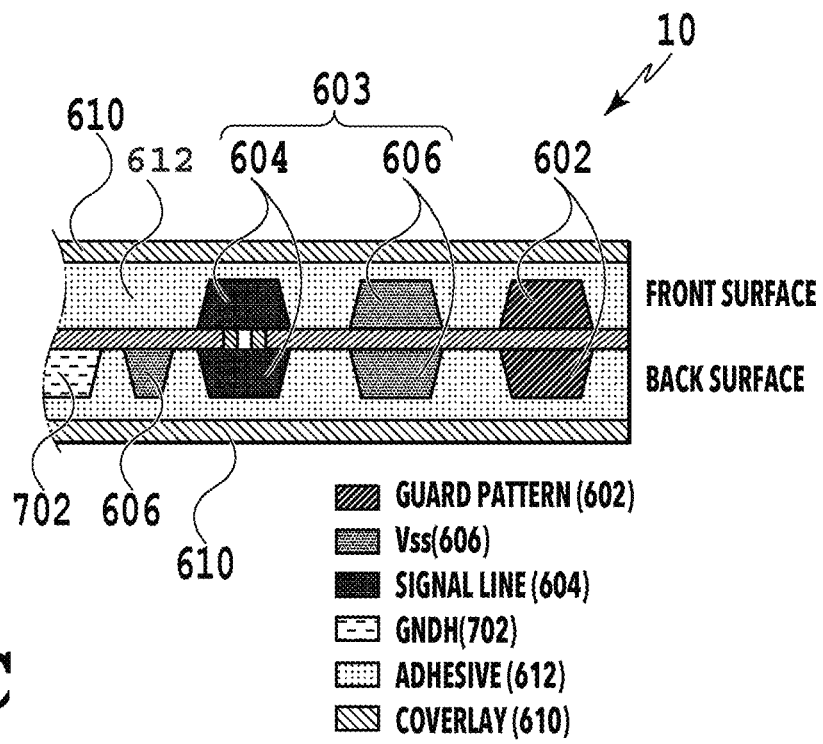
Figure 7D:
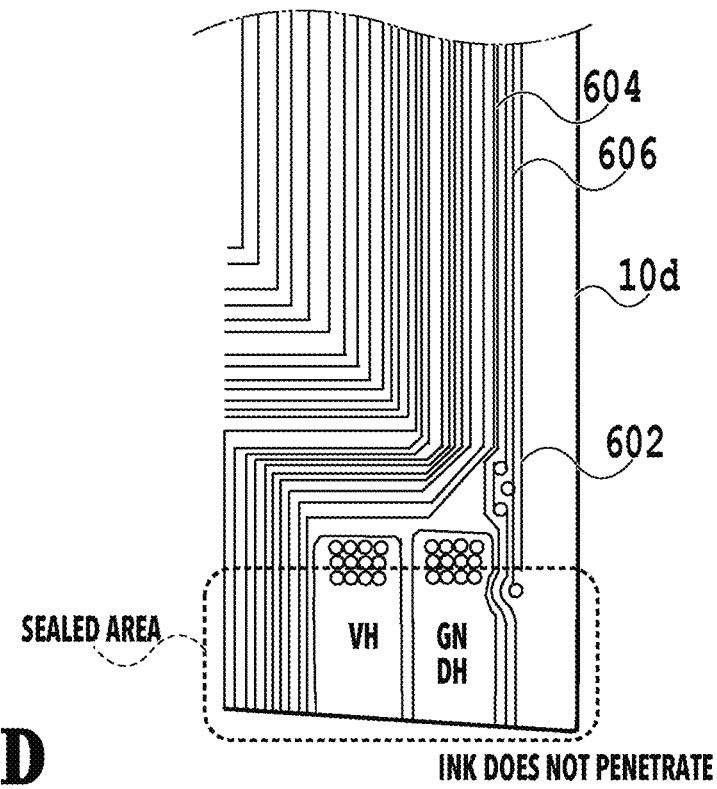

Next, the wiring part 603 installed next to the guard pattern 602 will be explained. FIG. 7A to FIG. 7D are diagrams illustrating a wiring part installed next to a guard pattern. FIG. 7A is an enlarged diagram in the frame VIIa of FIG. 2. FIG. 7B is a transmission diagram in which the wiring of the back surface in the frame VIIa of FIG. 2 is viewed from the front surface side in a transmissive manner. FIG. 7C is a cross-sectional diagram of the line VIIc-VIIc of FIG. 7A. FIG. 7D is an enlarged diagram in the frame VIId of FIG. 2.

In the upper layer and the lower layer of the flexible circuit board 10 of FIG. 7A to FIG. 7D, the guard pattern 602 is formed closest to the side part 10d. The VSS wiring 606, which is a low-potential ground wiring, is formed next to the guard pattern 602, and the anode signal line 604 is formed next to the VSS wiring 606. Further, in the upper layer, the GNDH wiring 702 is formed next to the anode signal line 604, and the VH wiring 704 is formed next to the GNDH wiring 702 (see FIG. 7A). On the other hand, in the lower layer, the VSS wiring 606 is formed next to the anode signal line 604, the GNDH wiring 702 is formed next to the VSS wiring 606, and the VH wiring 704 is formed next to the GNDH wiring 702 (see FIG. 7B).

If the anode signal line 604 is connected to the VSS wiring 606 and a short circuit occurs, the control part can detect the abnormality that has occurred in the anode signal line 604. That is, the signal value in the anode signal line 604 is monitored by the control part, and the control part is configured to be capable of detecting an abnormality in the signal from the anode signal line 604, based on the result of the monitoring. For example, it is desirable that the anode signal line 604 is a signal line of a thermometric diode (temperature sensor) whose signal value is constantly monitored by the control part or the like. Note that the anode signal line 604 is not limited to a signal line of a thermometric diode, and it is sufficient as long as the anode signal line 604 is a signal line whose signal value is monitored by the control part and will have an abnormality if the anode signal line 604 is electrically connected to a low-potential wiring such as the VSS wiring 606 and a short circuit occurs. The low potential is, for example, 6 V or less, and the high potential is, for example, 10 V or more.

Further, the anode signal line 604 may be a wiring that falls to the ground, that is, a wiring for which a normal control cannot be performed by the control part if a short circuit occurs with low-potential wiring such as the VSS wiring 606. Alternatively, the anode signal line 604 may be a signal line in which the control part provides an notification of an error based on a signal value. As the anode signal line 604, wiring related to driving of a heater which is a print element for ejecting ink, a sub-heater for adjusting the temperature of the print element substrate 16, etc., is excluded.

In a case where the anode signal line 604 is a signal line of a thermometric diode, if ink penetrates from the side part 10d of the flexible circuit board 10 and a short circuit occurs since the anode signal line 604 and the VSS wiring 606 are electrically connected by the ink, the temperature control by the control part becomes impossible. Accordingly, the control part determines that the state is abnormal, and, for example, the driving of the print head will be stopped.

=Guard Pattern and the Range Where the Wiring Part is Formed=

On an end side of the flexible circuit board 10 (that is, the end side connected to the electric wiring substrate 14 and the print element substrate 16), the GNDH wiring 702, which is connected via the through hole in each layer, is formed at the position illustrated in FIG. 7D. The reason why the GNDH wiring 702 is formed at the position illustrated in FIG. 7D is that the pad of the GNDH wiring in the substrate connected on the end side is formed at a position corresponding to the position.

In the flexible circuit board 10 configuring the print head, the vicinity of the end connected to the print element substrate 16 with wires is the portion where ink is most likely to adhere. Note that, although illustration is omitted in FIG. 7D, the portion to which the wires are connected is covered with a sealing material in order to prevent a short circuit between the wiring caused by adhesion of ink (see the portion of the dashed line frame in FIG. 7D). In the area sealed with this sealing material, since ink is unlikely to penetrate because of the sealing material, the guard pattern 602 and the wiring part 603 need not be formed on the end side, to which the print element substrate 16 is connected, from the area sealed with the sealing material. That is, the configuration in which the guard pattern 602, the anode signal line 604, and the VSS wiring 606 are arranged in this order from the side part 10d only needs to be formed from the edge (end) of the sealing material to the area that is not covered with the sealing material.

In FIG. 2, etc., the configuration in which the guard pattern 602, the anode signal line 604, and the VSS wiring 606 are arranged in this order from the side part 10d is uniformly formed in the vicinity of the side part 10d from the electric wiring substrate 14 side to the print element substrate 16 side. However, it is also possible that such a configuration is formed only in a partial area of the side part 10d. Specifically, for example, such a configuration may be formed only in the portion to which the ink adheres, i.e., the area corresponding to the portion to which the ink may adhere or the portion to which the ink easily adheres. Alternatively, such a configuration may be formed only in the area corresponding to the portion where a high-potential power source system is arranged.

=Guard Pattern and the Function of the Wiring Part=

Figure 8A:
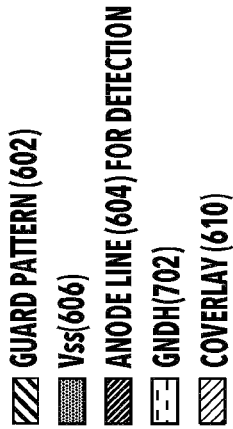
FIG. 8A to FIG. 8C are diagrams illustrating the penetration of ink from a side part equipped with a guard pattern and a wiring part.
Figure 8A:
Figure 8A:
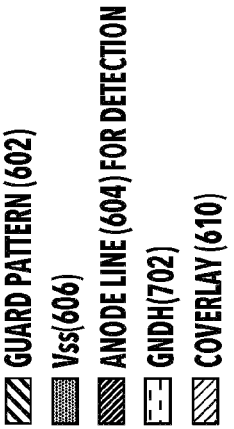
Figure 8A:
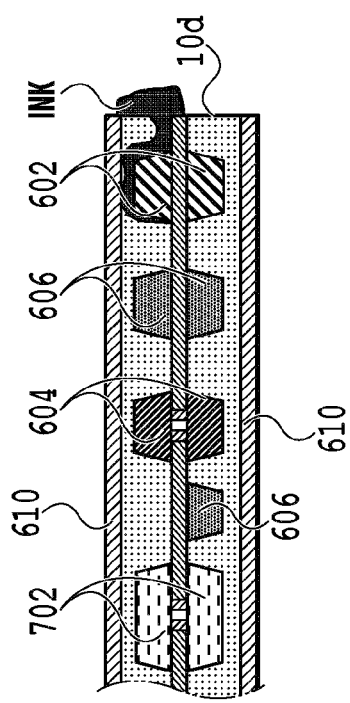
Figure 8B:
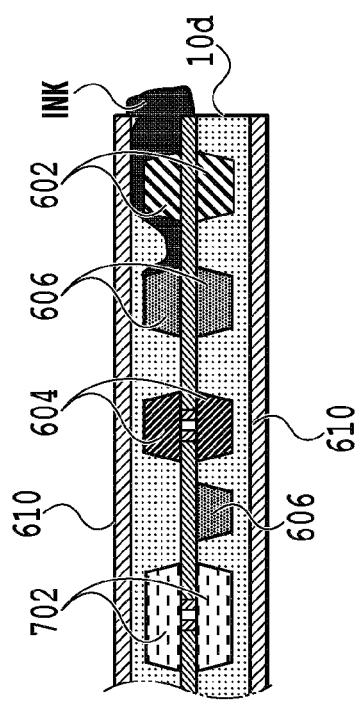
Figure 8C:
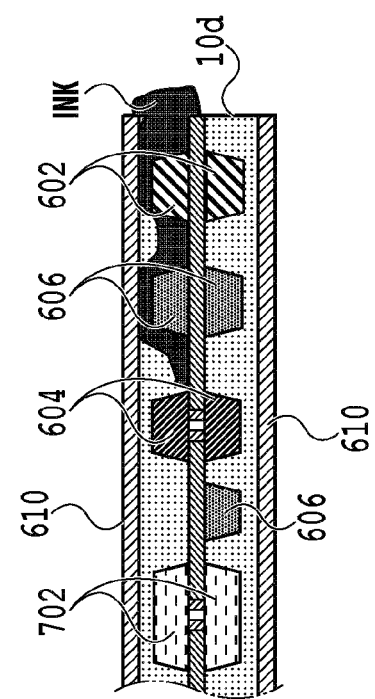

FIG. 8A to FIG. 8C, which are for explaining a case where ink has penetrated from the side part 10d of the flexible circuit board 10 in the above configuration, are diagrams in which states where ink has penetrated from a side part of a flexible circuit board equipped with a guard pattern and a wiring part are illustrated in chronological order. Note that, in FIG. 8A to FIG. 8C (FIG. 6A to FIG. 7D), the guard pattern 602, the VSS wiring 606, and the anode signal line 604 are formed in this order from the side part 10d in the upper layer and the lower layer. In the upper layer and the lower layer, the same wiring is connected via a through hole.

At the side part 10d of the flexible circuit board 10, if ink penetrates from the interface between the base material 608 and the adhesive 612 in the upper layer, the ink that has penetrated first reaches the guard pattern 602 (see FIG. 8A). Then, as the penetration of ink progresses, the ink reaches the VSS wiring 606 (see FIG. 8B), and the guard pattern 602 and the VSS wiring 606 are electrically connected via the ink. Note that, since the guard pattern 602 is electrically floated, i.e., not energized, such a large abnormality that damages the print head does not occur at this stage. Therefore, the control part of the printing apparatus connected via the electrical wiring substrate 14 does not detect an abnormality.

If the penetration of ink further progresses, the ink reaches the anode signal line 604 (see FIG. 8C), and the VSS wiring 606 and the anode signal line 604 are electrically connected via the ink, which results in a short circuit. The anode signal line is, for example, a signal line for a thermometric diode, and the control part always detects the temperature of the print element substrate 16, based on the signal value from the signal line. Therefore, the short circuit between the VSS wiring 606 and the anode signal line 604 causes an abnormality in the signal value that is input from the anode signal line 604, so that the control part detects an abnormality occurring in the print head, based on this abnormality. In this case, the abnormality of the print head detected by the control part is, more specifically, the occurrence of a failure of the thermometric diode or a short circuit in the flexible circuit board 10. Then, the control part stops the driving of the print head, provides a notification that an abnormality has occurred, or the like, based on the determination that an abnormality has occurred.

In this way, the wiring part 603 is configured to be capable of detecting the penetration of ink, and the guard pattern 602 is designed to safely delay the time until the wiring part 603 detects the penetration of ink. Further, the guard pattern 602 functions as a regulation part that regulates the penetration of ink.

=Specific Configuration of the Wiring Part=

In this way, in the flexible circuit board 10 according to the present embodiment, the guard pattern 602 is formed at a side part, and the wiring part 603 capable of detecting the penetration of ink is formed next to the guard pattern 602. The wiring part 603 capable of detecting the penetration of ink is configured with two wiring. These two wiring are not newly installed only for detecting the penetration of ink but are a combination of two wiring installed on a general flexible circuit board that configures a print head.

Figure 9A:
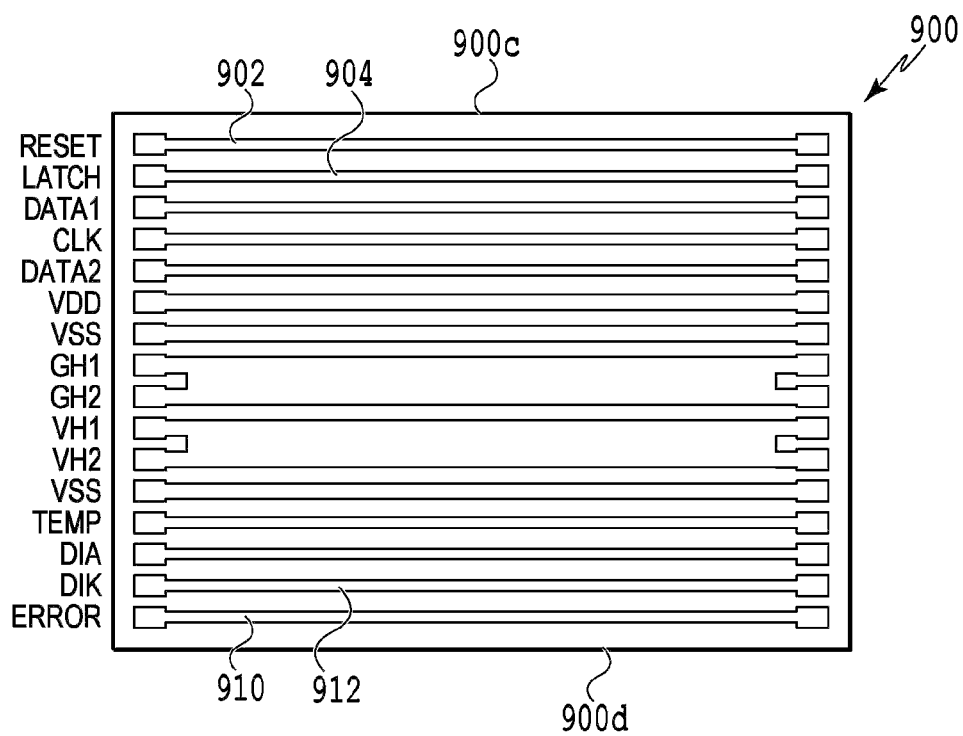
FIG. 9A and FIG. 9B are diagrams for explaining details of the wiring part.
Figure 9B:
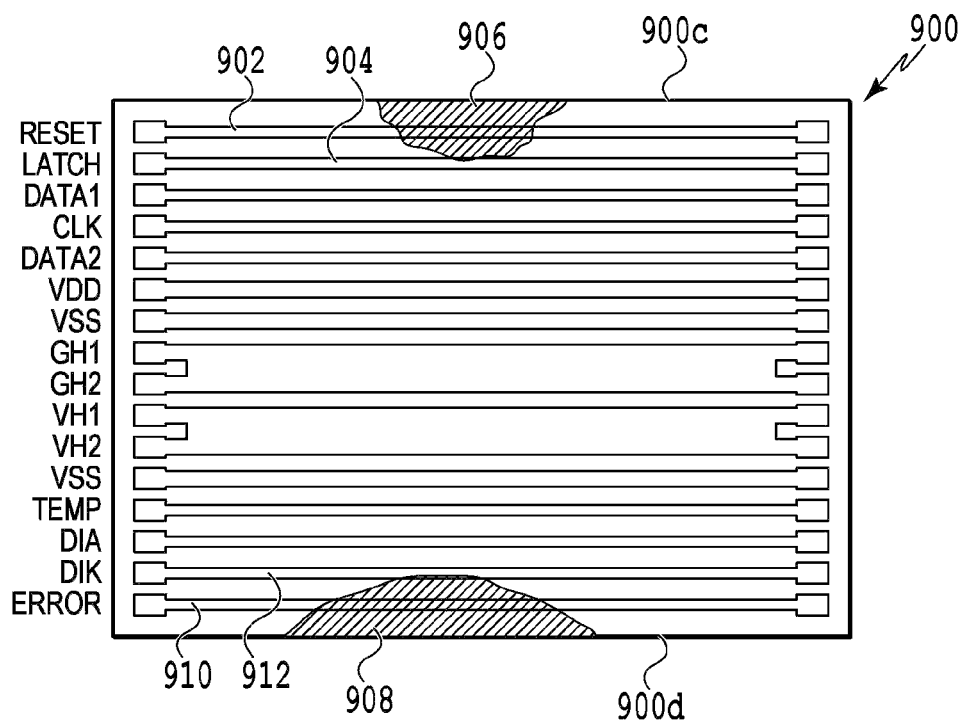

The wiring part 603, which is adjacent to the guard pattern 602 and is capable of detecting the penetration of ink, will be explained in more detail with specific examples. Note that, in order to facilitate understanding, the explanation of the wiring part 603 adjacent to the guard pattern 602 for detecting the penetration of ink, which is performed with reference to FIG. 9A and FIG. 9B, will be given by use of a wiring pattern without the guard pattern 602. FIG. 9A is a diagram illustrating an example of a wiring pattern formed on a flexible circuit board according to the prior art. FIG. 9B is a diagram illustrating a state where ink has penetrated from a side part of the flexible circuit board of FIG. 9A. The state where the ink has penetrated illustrated in FIG. 9B is merely an example, and the ink does not necessarily penetrate from the vicinity of the central portion of the side part as illustrated in the drawing. Note that, in order to facilitate understanding, a wiring pattern formed in a predetermined layer of a flexible circuit board is illustrated in FIG. 9A and FIG. 9B.

In the flexible circuit board 900 of FIG. 9A, for example, the reset signal line (RESRT) 902 is formed closest to one side, i.e., the side part 900c, and the latch signal line (LATCH) 904 is formed next to the reset signal line 902. Here, the reset signal transmitted via the reset signal line 902 is a digital signal of a truth value that is sent only once when the power is turned on. Further, the latch signal transmitted via the latch signal line 904 is a digital signal of a truth value that is sent each time for setting data during printing. These signals are sent from the control part (not illustrated in the drawings) of the printing apparatus via the electrical wiring substrate 14 and have equivalent driving performance.

It is assumed that ink penetrates from the side part 900c of the flexible circuit board 900 (see the area 906 of FIG. 9B) and a short circuit occurs since the reset signal line 902 and the latch signal line 904 are electrically connected. The reset signal remains "0" after "1" is sent for several microseconds when the power is turned on. However, since the reset signal and the latch signal has equivalent driving performance of the control part, the latch signal is not always changed to "0" due to the above-mentioned short circuit. Therefore, there is a case in which the latch signal that is output from the control part is transmitted to the print element substrate 16 as it is, and the print element operates normally, so that the control part cannot detect an abnormality, i.e., ink penetration. Note that the digital signal "1" indicates the power source voltage of the digital circuit, and the digital signal "0" indicates the ground voltage.

Further, in the flexible circuit board 900, for example, the error signal line (ERROR) 910 is formed closest to the other side, i.e., the side part 900d, and the temperature sensor signal line (DIK) 912 is formed next to the error signal line 910. Therefore, if ink penetrates from the side part 900d, a short circuit occurs since the error signal line 910 and the temperature sensor signal line 912 are electrically connected (see the area 908 of FIG. 9B). The error signal is a digital output signal that returns whether or not data reception has been normally performed from the print element substrate 16 to the control part. The print element substrate 16 outputs "1" in a case where the received data is not normal (for example, a part of the data is missing) and outputs "0" in a case where the data could be received normally.

As the temperature sensor, for example, a diode is used to detect the temperature of the print element substrate 16. The temperature sensor signal is an analog signal, and the temperature sensor signal that is output from the print element substrate 16 is converted from an analog signal into a digital signal in the control part. The temperature sensor signal line 912 is connected to a cathode terminal of a diode, and its voltage is the ground voltage. In this way, both the error signal and the temperature sensor signal have the ground voltage during normal driving. Therefore, even if a short circuit occurs between the error signal line 910 and the temperature sensor signal line 912 due to penetration of ink, the signal voltage does not change, so that there is a case in which the control part cannot detect an abnormality, i.e., penetration of ink.

Therefore, as the wiring part 603 capable of detecting the penetration of ink, two wiring satisfying the following conditions are formed so as to be adjacent to each other. The first condition is that the output value from one of the wiring or the operation based on the output value is monitored by the control part. The second condition is that, even if a short circuit occurs between one wiring and the other wiring, the control part and the flexible circuit board 10, the electrical wiring substrate 14, and the print element substrate 16 configuring the print head are not damaged.

SPECIFIC EXAMPLE 1

Figure 10:
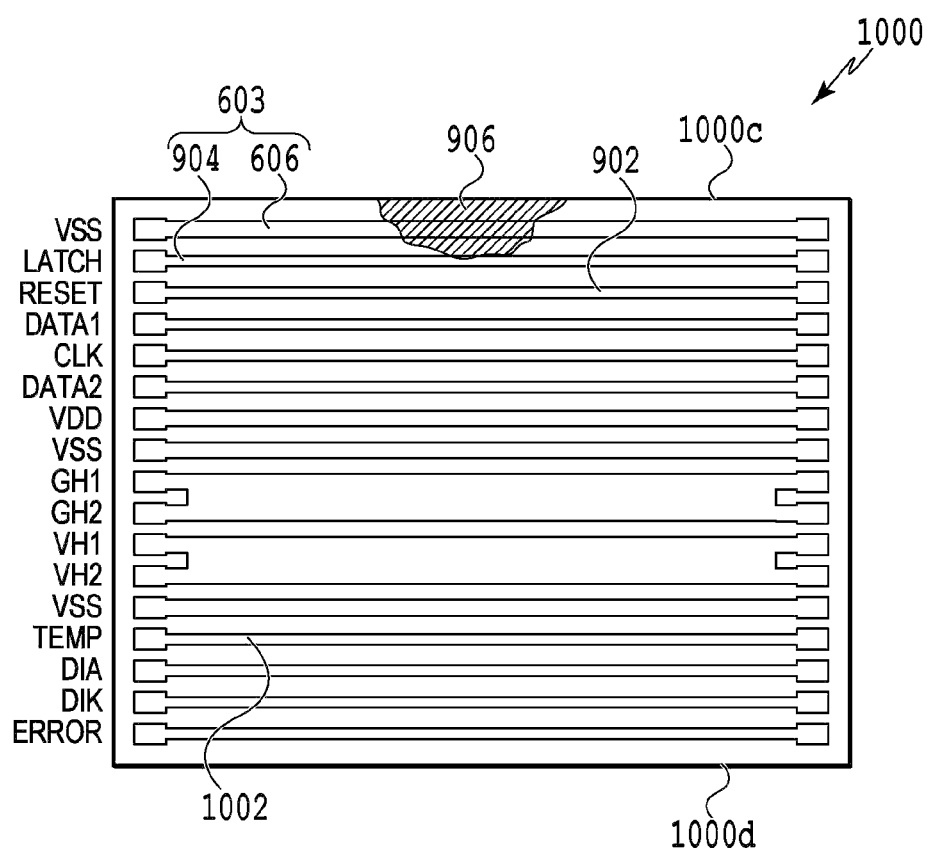
FIG. 10 is a diagram for explaining details of the wiring part.

FIG. 10 is a diagram illustrating an example of the wiring part capable of detecting ink penetration in the control part. Specifically, as in FIG. 10, in the flexible circuit board 1000, as the wiring part 603 capable of detecting the penetration of ink, the VSS wiring 606 is formed closest to the side part 1000c, and the latch signal line 904 is formed next to the VSS wiring 606. The driving performance of the latch signal for the control part is as low as about several milliamperes, the input impedance of the latch signal receiving circuit on the print element substrate 16 is sufficiently high, and the impedance of the VSS wiring 606 is sufficiently low. Therefore, if ink penetrates from the side part 1000c and a short circuit occurs between the VSS wiring 606 and the latch signal line 904, the latch signal is fixed to the ground voltage. Since the latch signal is a truth value, if the latch signal is fixed to the ground voltage, the data will not be latched, so that the print element (heater in the present embodiment) will not be driven.

Here, the control part periodically reads the temperature of the print element substrate 16 in order to maintain the print quality constant. In a case where the print element substrate 16 has a relatively large area, since there is a temperature distribution in the print element substrate 16, temperature sensors (not illustrated in the drawings) are arranged at multiple positions in the print element substrate 16. These temperature sensors are connected to a multiplexer (not illustrated in the drawings) in the print element substrate 16. In a case of reading the value of each temperature sensor, data for selecting one given temperature sensor is sent from the control part to the print element substrate 16, so that the temperature information of the selected temperature sensor is sent as an analog signal from the temperature signal line 1002 to the control part via the multiplexer. Further, to check whether the switching of the multiplexer based on the data for selecting a temperature sensor is successfully performed, at least one terminal of the multiplexer is connected to a voltage far from the normal temperature signal, such as the power source voltage or ground voltage.

Figure 11:
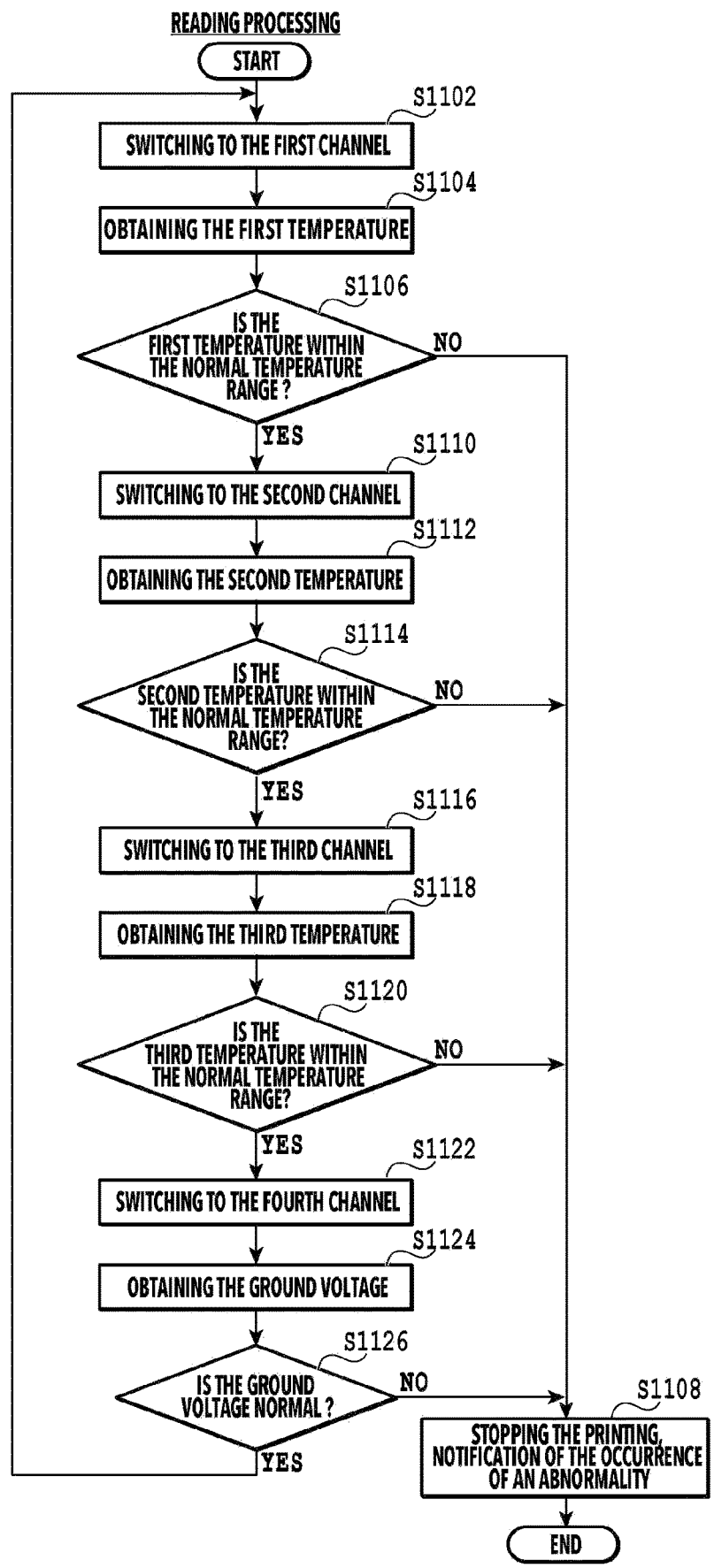
FIG. 11 is a flowchart illustrating the procedure of the reading processing.

The procedure of the reading processing for reading the temperature with the temperature sensor will be explained with reference to FIG. 11. Note that, in the explanation using FIG. 11, it is assumed that the print element substrate 16 is equipped with three temperature sensors and a four-channel multiplexer connected to the three temperature sensors and one VSS. FIG. 11 is a flowchart illustrating a detailed processing routine of the processing procedure of the reading processing.

If the reading processing is started, the control part first outputs a signal for switching the channel of the multiplexer to the first channel (S1102). Based on the signal for switching to the first channel, which is output from the control part, the multiplexer obtains the first temperature of the first temperature sensor corresponding to the first channel, so as to output the obtained first temperature as an analog signal to the control part via the temperature signal line 1002 (S1104). This analog signal is converted into a digital signal by an analog-digital converter (A/D converter) in the control part.

Next, the control part determines whether or not the first temperature is within the normal temperature range (S1106), and, if it is determined that the first temperature is not within the normal temperature range, the printing will be stopped and a notification that an abnormality has occurred to the print head will be provided (S1108), and then the reading processing will be ended. Further, in S1106, if it is determined that the first temperature is within the normal temperature range, the control part outputs a signal for switching the channel of the multiplexer to the second channel (S1110). Based on the signal for switching to the second channel, which is output from the control part, the multiplexer obtains the second temperature of the second temperature sensor corresponding to the second channel, so as to output the obtained second temperature as an analog signal to the control part via the temperature signal line 1002 (S1112).

Thereafter, the control part determines whether or not the second temperature is within the normal temperature range (S1114), and, if it is determined that the second temperature is not within the normal temperature range, the processing will proceed to S1108. Further, in S1114, if it is determined that the second temperature is within the normal temperature range, the control part outputs a signal for switching the channel of the multiplexer to the third channel (S1116). Based on the signal for switching to the third channel, which is output from the control part, the multiplexer obtains the third temperature of the third temperature sensor corresponding to the third channel, so as to output the obtained third temperature as an analog signal to the control part via the temperature signal line 1002 (S1118).

Upon obtaining the third temperature, the control part determines whether or not the third temperature is within the normal temperature range (S1120), and, if it is determined that the third temperature is not within the normal temperature range, the processing will proceed to S1108. Further, in S1120, if it is determined that the third temperature is within the normal temperature range, the control part outputs a signal for switching the channel of the multiplexer to the fourth channel (S1122). Based on the signal for switching to the fourth channel, which is output from the control part, the multiplexer will be connected to the VSS that is connected to the fourth channel, so as to obtain the ground voltage (S1124). Then, the control part determines whether or not the obtained ground voltage is normal (S1126).

If the ground voltage is, for example, 0.3 V or less, the control part determines that the ground voltage is normal. If it is determined to be normal in S1126, the processing will return to S1102. Further, if it is determined not to be normal in S1126, the processing will proceed to S1108. Note that the cycle for switching the channels of the multiplexer is, for example, 8 milliseconds.

If the ink penetrates from the side part 1000c of the flexible circuit board 1000 and a short circuit occurs since the VSS wiring 606 and the latch signal line 904 are electrically connected, the latch signal, which is a truth value, is fixed to the ground voltage. The data to be sent to the print element substrate 16 is determined by the latch signal. Therefore, if the data is not latched, even if the data is normally sent, the data will not be set by the print element substrate 16, so that the switching of the channels of the multiplexer will not be performed.

For example, in a case where the multiplexer is switched to the second channel last time the latch signal is normally transmitted to the print element substrate 16, the control part then sends the data for switching the multiplexer to the third channel to the print element substrate 16. However, if a short circuit has occurred between the VSS wiring 606 and the latch signal line 904, the data will not be set by the print element substrate 16 and the switching to the third channel will not be performed, so that the second temperature of the second temperature sensor will be output to the control part.

Accordingly, although the control part recognizes the input second temperature as the temperature information of the third temperature sensor, since the normal temperature ranges of the multiple temperature sensors usually all match, the temperature falls within a predetermined range of temperature distribution in the print element substrate 16, for example, within 10° C. Therefore, even if the second temperature is received as the temperature information of the third temperature sensor, the control part recognizes that the temperature is within the normal temperature range and performs a process of switching the multiplexer to the fourth channel. Thereafter, although the control part determines whether or not the ground voltage is normal, since the multiplexer is not switched on the print element substrate 16, the voltage of the second temperature is input to the control part. For example, if the temperature characteristic of the temperature sensor is 0.65 V at 25° C., the rate of change is −2 mV/° C., and the normal temperature range is 0 to 100° C., the temperature characteristic will be 0.5 V at 100° C., which exceeds the normal range (less than 0.3) of the ground voltage. Therefore, the control part regards that an abnormality has occurred in the mechanism for detecting the temperature, so as to stop printing and provide a notification of the occurrence of the abnormality.

In this way, by configuring the wiring part 603 capable of detecting the penetration of ink with the VSS wiring 606 and the latch signal line 904 (corresponding to the anode signal line 604), the latch signal can be dropped to the ground voltage by the penetration of ink. Since the driving performance of the latch signal is low, even if a short circuit occurs between the latch signal line 904 and the VSS wiring, it is unlikely that the control part, the print element substrate 16, or the like will be immediately damaged. Therefore, by configuring the wiring part 603 capable of detecting the penetration of ink with the VSS wiring 606 and the latch signal line 904, it is possible to regard that an abnormality has occurred in the print head without damaging the print element substrate 16 or the control part and to detect the penetration of ink.

SPECIFIC EXAMPLE 2

Figure 12:
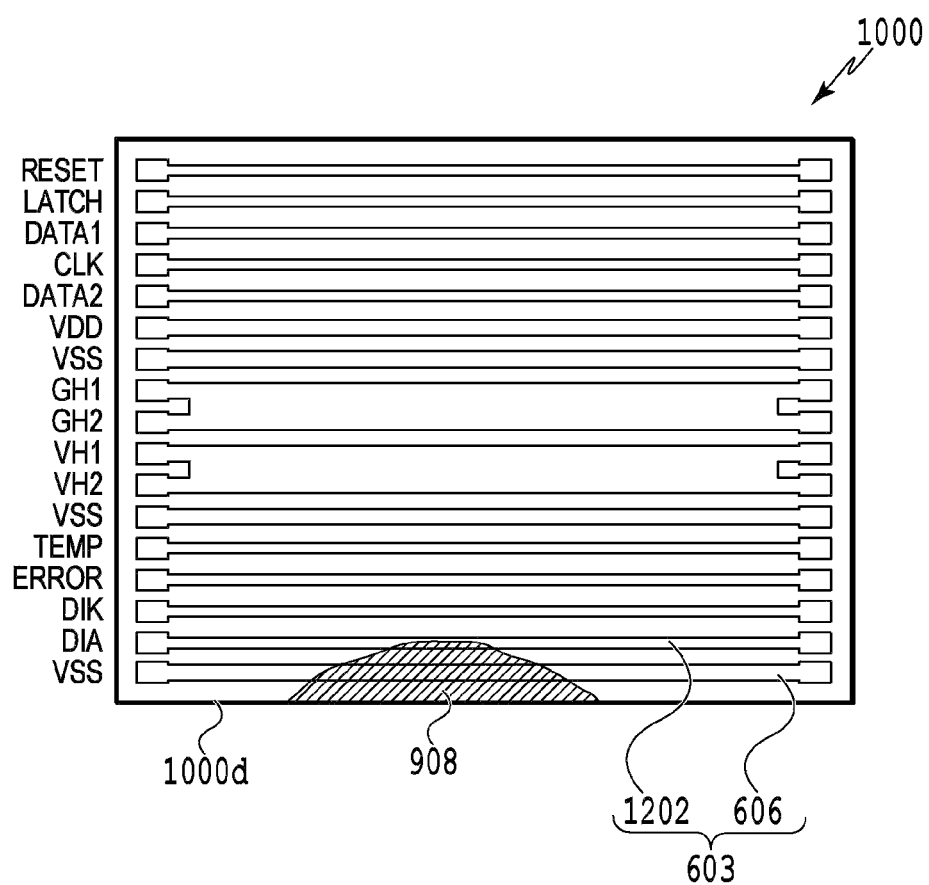
FIG. 12 is a diagram for explaining details of the wiring part.

FIG. 12 is a diagram illustrating another example of the wiring part capable of detecting ink penetration in the control part. As another specific example, the wiring part 603 is configured with the temperature sensor signal line (DIA) 1202 for a temperature sensor, which is independently installed without being connected to the multiplexer among multiple temperature sensors arranged on the print element substrate 16, and the VSS wiring 606 (see FIG. 12). In FIG. 12, the VSS wiring 606 is arranged at the other side, i.e., the side part 1000d, and the temperature sensor signal line 1202 is formed next to the VSS wiring 606.

The input impedance of the A/D converter installed in the control part is sufficiently high, and the driving performance of the temperature sensor drive circuit is as low as 1 mA or less. Therefore, if the liquid penetrates from the side part 1000d (see the area 908 of FIG. 12), a short circuit occurs since the temperature sensor signal line 1202 and the VSS wiring 606 are connected by the ink. Further, due to this short circuit, the temperature sensor signal becomes the ground voltage.

In a case where the temperature characteristic of the temperature sensor is 0.65V at 25° C., the rate of change is −2mV/° C., and the normal temperature range is 0 to 100° C., the control part recognizes the temperature as 300° C. if the temperature sensor signal becomes the ground voltage. For example, in a case where the control part is designed to determine that exceeding of 100° C. is an abnormal temperature rise, the control part can determine that an abnormality has occurred in the print head due to the abnormal temperature rise, so as to stop printing and provide a notification that the abnormality has occurred.

Note that arranging the temperature sensor signal line 1202 for analog signals and the VSS wiring 606 next to each other is also effective in suppressing the influence of external noise on the analog signals. Further, by arranging the VSS wiring 606 near the side part 1000d, the temperature sensor signal line 1202 can be surely dropped to the ground voltage. Further, since the temperature sensor drive circuit is, for example, a constant current circuit that outputs 0.2 mA, it is unlikely that the temperature sensor drive circuit will have a trouble even if the temperature sensor signal line 1202 has a short circuit with the VSS wiring 606.

Figure 13A:
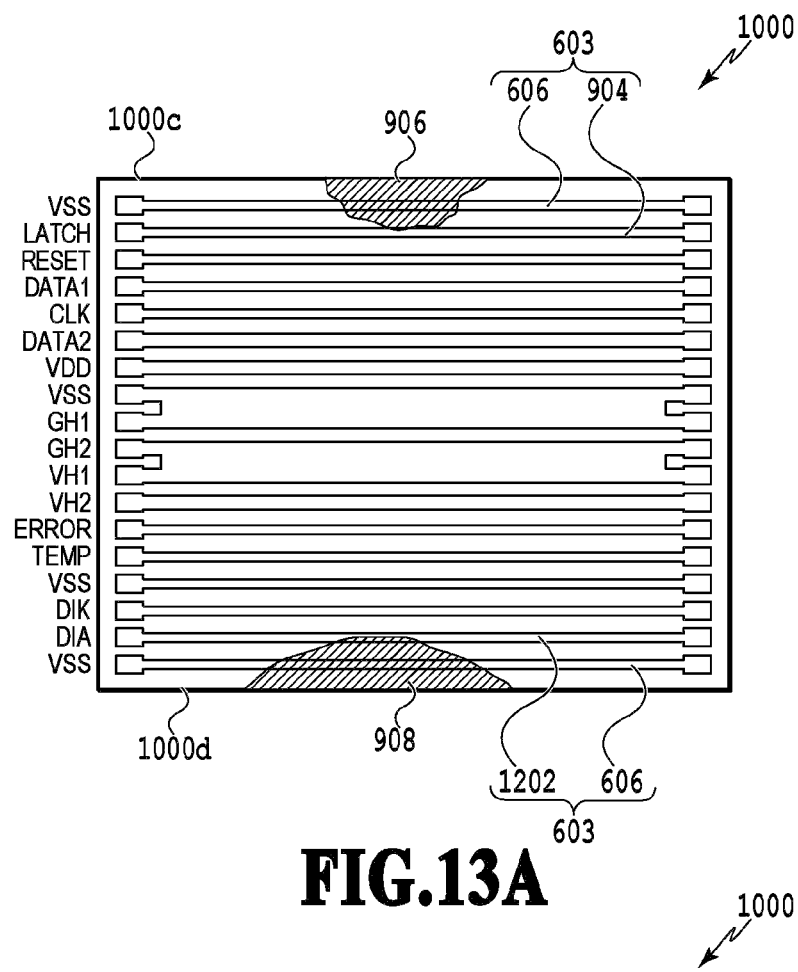
FIG. 13A and FIG. 13B are diagrams illustrating modified examples of a specific example of the wiring part.
Figure 13B:
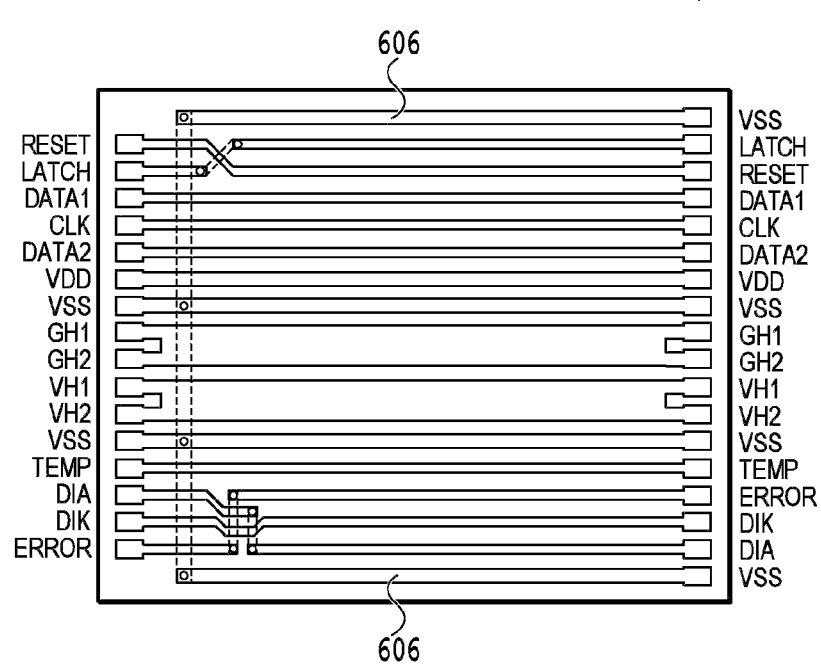

Of the side parts 1000c and 1000d, one may be equipped with the configuration of the specific example 1 and the other may be formed with the configuration of the specific example 2 (see FIG. 13A). FIG. 13A and FIG. 13B are diagrams illustrating modified examples of a specific example of the wiring part. In this way, it is possible to detect an abnormality due to ink penetration from both side parts of the flexible circuit board 10. In a case where it is difficult to change the terminal arrangement of the print element substrate, another layer may be utilized to form the VSS wiring closest to the side part, as in FIG. 13B. Although not illustrated in the drawings, the guard patterns 602 are formed closer to the side parts than the wiring parts 603.

As explained above, in the flexible circuit board 10 according to the present embodiment, a side part or the position closest to a side part is equipped with the guard pattern 602 that is not energized. Further, next to the guard pattern 602, the wiring part 603 capable of detecting the penetration of ink is installed. The wiring part 603 is configured with a low-potential ground wiring and an anode signal line whose signal value and operation based on the signal value are monitored. Further, such a position where the guard pattern 602 and the wiring part 603 are formed is set to a position where a high-potential wiring is arranged at least in the vicinity thereof.

Accordingly, even if the ink penetrates from the side part of the flexible circuit board 10, a short circuit occurs between the ground wiring and the anode signal line before the ink reaches the high-potential wiring and a short circuit occurs between the wiring and the tied-up wiring. Since the anode signal line is monitored for its signal value or operation based on the signal value, an abnormality in the signal value or operation due to a short circuit will be checked. That is, it becomes possible to detect that the print head does not operate normally due to the penetration of ink into the flexible circuit board 10 without damaging other members or the like configuring the print head.

Further, with the presence of the guard pattern 602, it is possible to delay the timing of a short circuit between the ground wiring and the anode signal line. Accordingly, it is possible to increase the time period in which the print head can be used normally.

Other Embodiments

Note that the above-described embodiments may be modified as shown in the following (1) through (4).

Figure 14A:
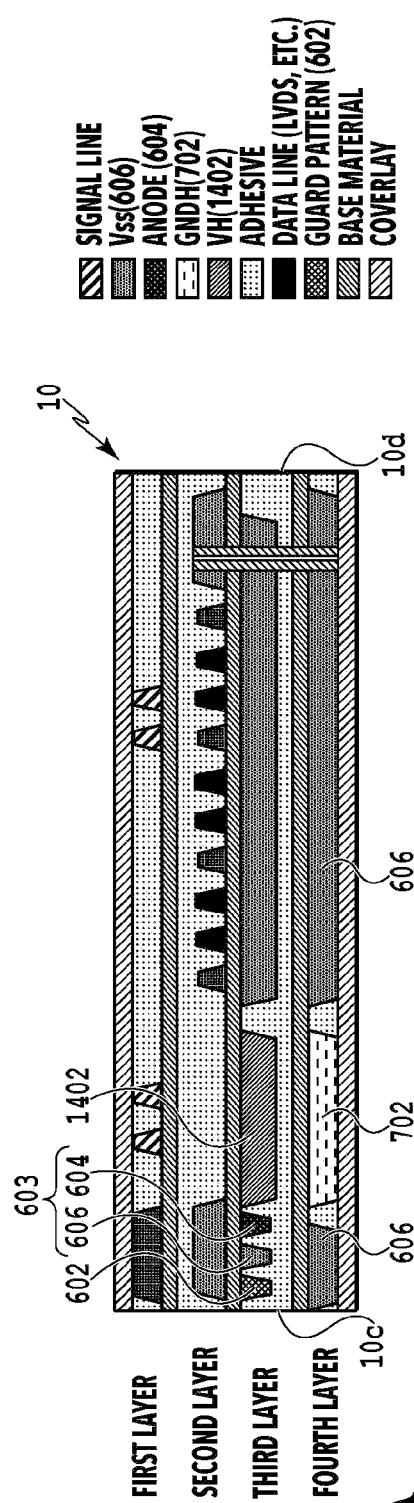
FIG. 14A to FIG. 14C are diagrams illustrating modified examples of a flexible circuit board according to an embodiment.

(1) Although not particularly described in the above embodiment, a flexible circuit board with a four-layer structure has such a configuration such as in FIG. 14A and FIG.

Figure 14B:
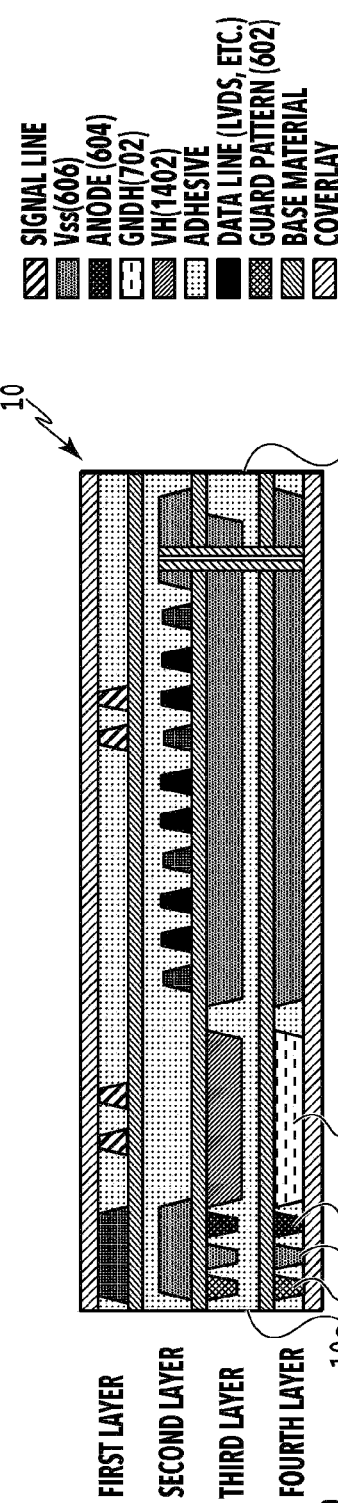
Figure 14C:
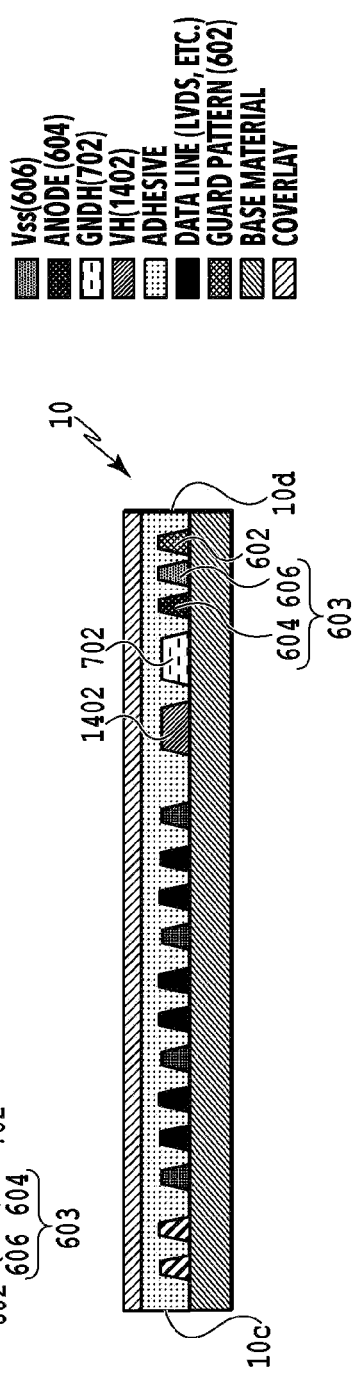

14B, for example, and a flexible circuit board with a single-layer structure has such a configuration as in FIG. 14C, for example. Note that, as with the flexible circuit board with a two-layer structure described above, the configurations of the flexible circuit boards with the four-layer structure and the single-layer structure illustrated in FIG. 14A to FIG. 14C are examples of the configurations and are not limited to the configurations illustrated in FIG. 14A to FIG. 14C.

In the flexible circuit board 10 with a four-layer structure illustrated in FIG. 14A, in the third layer where the high-potential liquid VH wiring 1402 is formed, the guard pattern 602, the VSS wiring 606, and the anode signal line 604 are formed in the vicinity of the one side part 10c in order from the side part 10c. Further, the VH wiring 1402 is formed next to the anode signal line 604. In this case, it is possible to detect that an abnormality occurs in the print head due to a short circuit between the VSS wiring 606 and the anode signal line 604 before the ink that penetrates from the side part 10c to the third layer reaches the VH wiring 1402.

Although both sides of the GNDH wiring 702 are surrounded by the VSS wiring 606 in the fourth layer of the flexible circuit board 10 with a four-layer structure illustrated in FIG. 14A, it is also possible that only the GNDH wiring 702 is formed in the fourth layer. Further, in the flexible circuit board 10 with a four-layer structure illustrated in FIG. 14A, the configuration with the guard pattern 602, the VSS wiring 606, and the anode signal line 604 is arranged on the side part 10c side of the VH wiring 1402 only in the third layer. However, for example, in a case where the VH wiring 1402 is formed with a wide width up to the vicinity of the side part 10d, the same configuration is formed on the side part 10c side as well. Further, for example, in a case where the VH wiring 1402 is formed near the side part 10c or the side part 10d of another layer, the configuration with the guard pattern 602, the VSS wiring 606, and the anode signal line 604 is formed on the side part side of the VH wiring 1402.

In the flexible circuit board 10 with a four-layer structure illustrated in FIG. 14B, the first layer, the second layer, and the third layer have the same configurations as in the flexible circuit board 10 with a four-layer structure illustrated in FIG. 9A. In the fourth layer, the configuration with the guard pattern 602, the VSS wiring 606, and the anode signal line 604 is formed on the side part 10c side of the GNDH wiring 702 installed on the side part 10c side. Accordingly, in the fourth layer, even if ink penetrates from the side part 10c, it is possible to detect that an abnormality has occurred in the print head due to a short circuit between the VSS wiring 606 and the anode signal line 604 before the ink reaches the high-potential GNDH wiring 702.

In the flexible circuit board 10 with a single-layer structure illustrated in FIG. 14C, the high-potential GNDH wiring 702 and the VH wiring 1402 are formed on the side part 10d side. Further, at positions closer to the side part 10d than these, the guard pattern 602, the VSS wiring 606, and the anode signal line 604 are formed in this order from the side part 10d side. Accordingly, even if ink penetrates from the side part 10d, it is possible to detect that an abnormality has occurred in the print head due to a short circuit between the VSS wiring 606 and the anode signal line 604 before the ink reaches the high-potential wiring.

(2) Although the guard pattern 602 is installed on a side part side of the wiring part 603 in the above-described embodiment, there is not a limitation as such. That is, the guard pattern 602 may not be installed, and only the wiring part 603 may be installed on a side part side of a high-potential wiring. Accordingly, although the time period from the start of ink penetration into the flexible circuit board 10 to the detection that an abnormality has occurred in the print head is shortened, it is possible to detect the abnormality as in the above-described embodiment.

(3) Although the wiring part 603 is installed on a high-potential wiring side relative to the guard pattern 602, there is not a limitation as such. That is, the wiring part 603 may not be installed, and only the guard pattern 602 may be installed closest to a side part. Accordingly, even if the ink starts to penetrate into the flexible circuit board 10, it is possible to gain time until the high-potential wiring has a short circuit with other wiring due to the ink.

(4) The above-described embodiments and various forms shown in (1) through (3) may be combined as appropriate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-152047, filed Sep. 17, 2021, which is hereby incorporated by reference wherein in its entirety.

What is claimed is:

1. A flexible printed circuit board whose end part side is connected to a print element substrate capable of ejecting ink using a print element, so as to be capable of transmitting a signal from a control part of a printing apparatus to the print element substrate via wiring and to be capable of transmitting a signal from the print element substrate to the control part via the wiring,
   wherein a side part side of high-potential wiring includes at least one of a regulation part that regulates penetration of ink and a wiring part that is configured with low-potential ground wiring and low-potential signal line whose signal value transmitted by the control part or operation based on a signal is monitored.

2. The flexible printed circuit board according to claim 1, wherein, in a case where the regulation part and the wiring part are included, the regulation part, the low-potential ground wiring, and the signal line are arranged in this order from the side part side.

3. The flexible printed circuit board according to claim 1, wherein the regulation part is formed of a metallic material.

4. The flexible printed circuit board according to claim 3, wherein the regulation part is not electrically connected.

5. The flexible printed circuit board according to claim 3, wherein the regulation part is connected to independent ground wiring.

6. The flexible printed circuit board according to claim 1, wherein the regulation part is formed of a non-conductive material.

7. The flexible printed circuit board according to claim 1, wherein the signal line is wiring that transmits a latch signal for setting data.

8. The flexible printed circuit board according to claim 1, wherein the signal line is wiring that transmits a signal from a temperature sensor installed on the print element substrate.

9. The flexible printed circuit board according to claim 1, wherein the regulation part and the wiring part are uniformly formed on the side part side.

10. The flexible printed circuit board according to claim 1, wherein the regulation part and the wiring part are formed only in an area corresponding to the high-potential wiring on the side part side.

11. The flexible printed circuit board according to claim 1, wherein low-potential is 6 V or less and high-potential is 10 V or more.

12. The flexible printed circuit board according to claim 1, wherein the regulation part and the wiring part are formed in a plurality of layers.

13. A print head comprising:
a print element substrate capable of ejecting ink by driving a print element; and
a flexible printed circuit board whose end part side is connected to the print element substrate capable of ejecting ink using the print element, so as to be capable of transmitting a signal from a control part of a printing apparatus to the print element substrate via wiring and to be capable of transmitting a signal from the print element substrate to the control part via the wiring, wherein a side part side of high-potential wiring includes at least one of a regulation part that regulates penetration of ink and a wiring part that is configured with low-potential ground wiring and low-potential signal line whose signal value transmitted by the control part or operation based on a signal is monitored.

* * * * *